(12) United States Patent
Chung

(10) Patent No.: US 12,058,848 B2
(45) Date of Patent: Aug. 6, 2024

(54) SEMICONDUCTOR STRUCTURE HAVING AIR GAP

(71) Applicant: NANYA TECHNOLOGY CORPORATION, New Taipei (TW)

(72) Inventor: Lu-Wei Chung, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 27 days.

(21) Appl. No.: 17/852,416

(22) Filed: Jun. 29, 2022

(65) Prior Publication Data

US 2024/0008252 A1    Jan. 4, 2024

(51) Int. Cl.
*H10B 12/00* (2023.01)

(52) U.S. Cl.
CPC .................................. *H10B 12/31* (2023.02)

(58) Field of Classification Search
CPC ...................................................... H10B 12/31
USPC ........................................................... 257/295
See application file for complete search history.

(56) References Cited

U.S. PATENT DOCUMENTS

| | | | | |
|---|---|---|---|---|
| 2004/0023457 A1* | 2/2004 | Moore | .................. | H01L 27/101 438/257 |
| 2011/0042733 A1* | 2/2011 | Komeda | .............. | H10B 12/315 257/296 |
| 2012/0058639 A1* | 3/2012 | Sim | ........................ | H10B 43/27 438/666 |
| 2014/0061736 A1* | 3/2014 | Hwang | ............... | H01L 21/7682 257/737 |
| 2014/0264953 A1* | 9/2014 | Lim | ................... | H01L 21/76897 257/786 |
| 2015/0372060 A1* | 12/2015 | Terai | ...................... | H10B 63/84 257/773 |
| 2017/0365504 A1* | 12/2017 | Choi | .................... | H01L 21/0217 |

FOREIGN PATENT DOCUMENTS

| | | | |
|---|---|---|---|
| CN | 105008879 | * | 10/2015 |
| JP | 2020155764 | * | 9/2020 |
| KR | 20010105760 | * | 11/2001 |
| KR | 20020034493 | * | 5/2002 |
| TW | 202114060 A | | 4/2021 |
| TW | 202115871 A | | 4/2021 |
| TW | I757043 B | | 3/2022 |
| TW | I763353 B | | 5/2022 |
| WO | WO 2005071739 | * | 8/2005 |

OTHER PUBLICATIONS

Office Action and and the search report mailed on Nov. 13, 2023 related to Taiwanese Application No. 112108900.

* cited by examiner

*Primary Examiner* — Sheng-Bai Zhu
(74) *Attorney, Agent, or Firm* — Xuan Zhang

(57) ABSTRACT

The present disclosure provides a semiconductor structure having an air gap with a height greater than or equal to that of an adjacent bit line. The semiconductor structure includes a substrate; a first bit line structure disposed over the substrate; a second bit line structure disposed adjacent to the first bit line structure over the substrate; a first dielectric layer, surrounding the first bit line structure and the second bit line structure; and an air gap, disposed between the first bit line structure and the second bit line structure, and sealed by the first dielectric layer, wherein a height of the air gap is greater than or equal to a height of the first bit line structure.

8 Claims, 27 Drawing Sheets

SEMICONDUCTOR STRUCTURE HAVING AIR GAP

TECHNICAL FIELD

The present disclosure relates to a semiconductor structure. Particularly, the present disclosure relates to a semiconductor structure having an air gap.

DISCUSSION OF THE BACKGROUND

Due to a simplicity of structures of dynamic random-access memories (DRAM), compared to other types of memory such as static random-access memories (SRAM), a DRAM can provide more memory cells per chip area. The DRAM is composed of multiple DRAM cells. Each DRAM cell includes a capacitor for storing information and a transistor coupled to the capacitor to control when the capacitor is charged or discharged. During a read operation, a word line (WL) is asserted, thereby turning on the transistor. The turned-on transistor allows a sense amplifier to read a voltage across the capacitor through a bit line (BL). During a write operation, data to be written is provided to the BL when the WL is contacted.

In order to meet a demand for greater amounts of memory storage, sizes of DRAM memory cells continue to decrease; as such, a packaging density of the DRAMs has greatly increased. However, due to the size reduction of the DRAM memory cells, capacitive coupling, which leads to increases in parasitic capacitance, has become an increasingly important issue. As a result of the parasitic capacitance, a speed of the DRAM memory cell is undesirably reduced, and an overall device performance is negatively affected.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure, which includes: a substrate; a first bit line structure disposed over the substrate; a second bit line structure disposed adjacent to the first bit line structure over the substrate; a first dielectric layer, surrounding the first bit line structure and the second bit line structure; and an air gap, disposed between the first bit line structure and the second bit line structure, and sealed by the first dielectric layer, wherein a height of the air gap is greater than or equal to a height of the first bit line structure.

In some embodiments, the first dielectric layer encircles the air gap.

In some embodiments, the first dielectric layer includes a compound selected from a silane family.

In some embodiments, the first bit line structure includes a first metal layer, a first metal nitride layer, a first oxide layer, and a first nitride layer stacked in sequence from the substrate.

In some embodiments, the second bit line structure includes a second metal layer, a second metal nitride layer, a second oxide layer, and a second nitride layer stacked in sequence from the substrate.

In some embodiments, a vertical distance between a top of the air gap and a bottom of the second bit line is greater than or equal to a height of the second bit line.

In some embodiments, the semiconductor structure further includes a second dielectric layer, disposed over the first dielectric layer.

In some embodiments, the first dielectric layer and the second dielectric layer include different silanes.

In some embodiments, a width of the first bit line structure is in a range of 20 to 50 nanometers.

In some embodiments, a distance between the first bit line structure and the second bit line structure is in a range of 10 to 50 nanometers.

In some embodiments, the semiconductor structure further includes a landing pad, disposed between the substrate and the first bit line structure and electrically connected to the first bit line structure.

Another aspect of the present disclosure provides a semiconductor structure. The semiconductor structure includes: a substrate; a word line, disposed over the substrate and extending parallel to the substrate along a first direction; a first bit line, disposed over the word line and extending parallel to the substrate along a second direction different from the first direction; a second bit line, disposed at a same level as the first bit line and extending along the second direction; an air gap, disposed between the first bit line and the second bit line, and extending along the second direction; and a dielectric layer, disposed over and between the first bit line and the second bit line, wherein the air gap is at least disposed between a top of the first bit line and a top of the dielectric layer.

In some embodiments, the semiconductor structure further includes an isolation, disposed between the first bit line and the word line.

In some embodiments, the semiconductor structure further includes a first landing pad, disposed between the first bit line and the word line; and a second landing pad, disposed between the second bit line and the word line.

In some embodiments, the air gap is disposed at least between the first landing pad and the second landing pad.

In some embodiments, the first direction is substantially perpendicular to the second direction.

In some embodiments, the dielectric layer includes one or more of silane and TEOS.

In some embodiments, the semiconductor structure further includes an isolation, disposed between the first bit line and the substrate, and between the second bit line and the substrate, wherein the air gap is disposed at least between portions of the isolation.

In some embodiments, a thickness of a vertical portion of the dielectric layer on a sidewall of the first bit line is less than a thickness of a horizontal portion of the dielectric layer on a top of the first bit line.

In some embodiments, the thickness of the vertical portion of the dielectric layer is in a range of 1 to 7 nanometers.

In some embodiments, a width of the air gap is in a range of 8 to 36 nanometers.

In some embodiments, the semiconductor structure further includes a redistribution structure, disposed over the dielectric layer and electrically connected to the first bit line or the second bit line.

Another aspect of the present disclosure provides a method for manufacturing a semiconductor structure. The method includes: forming a first bit line and a second bit line over a substrate; forming a first dielectric layer conformally over the first bit line and the second bit line; and connecting a portion of the first dielectric layer over a top of the first bit line to a portion of the first dielectric layer over a top of the second bit line.

In some embodiments, the forming of the first bit line and the second bit line includes: forming a metal layer over the substrate; forming a metal-containing layer over the metal layer; forming an oxygen-containing layer over the metal-containing layer; forming a hard layer over the oxygen-containing layer; and patterning the metal layer, the metal-containing layer, the oxygen-containing layer and the hard layer.

In some embodiments, the patterning of the metal layer, the metal-containing layer, the oxygen-containing layer and the hard layer includes: forming a patterned layer over the hard layer; and removing portions of the metal layer, the metal-containing layer, the oxygen-containing layer and the hard layer exposed through the patterned layer.

In some embodiments, the first dielectric layer is formed by a chemical vapor deposition (CVD).

In some embodiments, a deposition rate of the CVD is greater than 70 angstroms per second.

In some embodiments, the first dielectric layer includes silane.

In some embodiments, the connecting of the portion of the first dielectric layer over the top of the first bit line to the portion of the first dielectric layer over the top of the second bit line defines an air gap between the first bit line and the second bit line.

In some embodiments, the method further includes forming a second dielectric layer over the first dielectric layer.

In some embodiments, the second dielectric layer is formed by a chemical vapor deposition (CVD).

In some embodiments, a deposition rate of the second dielectric layer is less than a deposition rate of the first dielectric layer.

In some embodiments, the method further includes planarizing the second dielectric layer.

In some embodiments, the method further includes forming a redistribution layer over the second dielectric layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
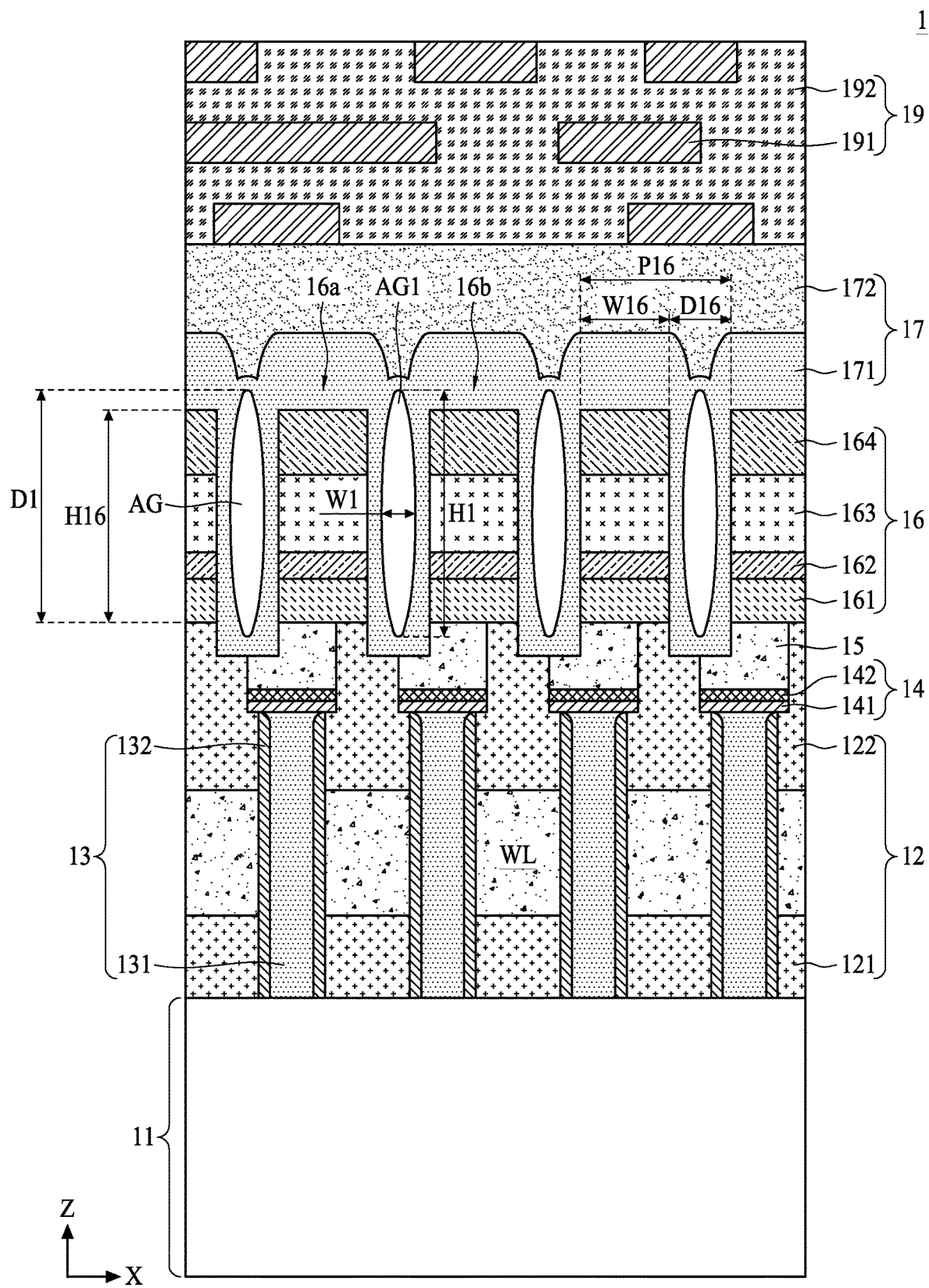
FIG. 1 is a cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
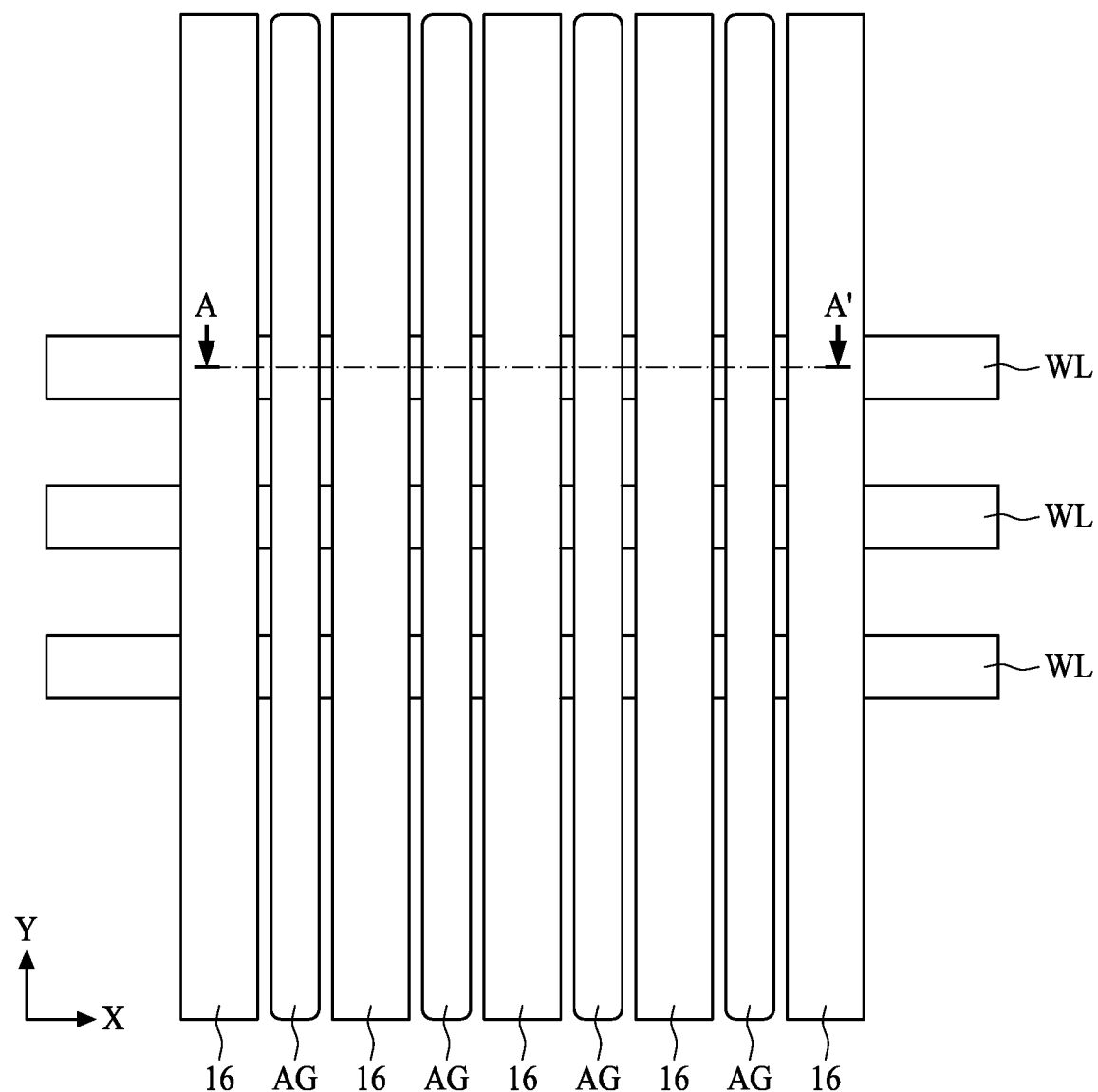
FIG. 2 is a top view perspective of the semiconductor structure of FIG. 1 in accordance with some embodiments of the present disclosure.

FIG. 1 is a schematic cross-sectional view of a semiconductor structure 1 in accordance with some embodiments of the present disclosure. FIG. 2 is a top view perspective of the semiconductor structure 1 of FIG. 1, in which FIG. 1 is depicted along a line A-A' in FIG. 2. In accordance with the embodiments, the semiconductor structure 1 includes: a substrate 11, an isolation 12, a word line structure WL, a plurality of bit line structures 16, a dielectric layer 17, a plurality of air gaps AG, and a redistribution layer (RDL) 19. The substrate 11 may be a semiconductor substrate. In some embodiments, the substrate 11 includes different components and/or one or more electrical devices. In some embodiments, the substrate 11 includes a transistor in an active region. The word line structure WL is disposed over and extends parallel to the substrate 11. In some embodiments, the word line structure WL extends along an X direction over the substrate 11. In some embodiments, the word line structure WL is disposed on the substrate 11 in the active region. In some embodiments, the word line structure WL is separated from the substrate 11 by the isolation 12. In some embodiments, a portion 121 of the isolation 12 is disposed between the substrate 11 and the word line structure WL. In some embodiments, the word line structure WL is electrically connected to the substrate 11. In some embodiments, the word line structure WL is electrically connected to one or more transistors in the substrate 11.

The bit line structures 16 are disposed on the word line structure WL over the substrate 11. In some embodiments, each of the bit line structures 16 extends along a Y direction, which is substantially perpendicular to the X direction. In some embodiments, each of the bit line structures 16 has a width W16 in a range of 20 to 50 nanometers. In some embodiments, a distance D16 between two adjacent bit line structures 16 is in a range of 10 to 50 nanometers. In some embodiments, a pitch P16 of the bit line structures 16 is in a range of 30 to 100 nanometers. In some embodiments, the bit line structures 16 are separated from the word line structure WL by a portion 122 of the isolation 12. In some embodiments, the bit line structures 16 are disposed on the substrate 11 in the active region. In some embodiments, the bit line structures 16 are electrically connected to the substrate 11. In some embodiments, the bit line structures 16 are electrically connected to one or more transistors in the substrate 11.

In some embodiments, the semiconductor structure 1 further includes a plurality of contact structures 13 disposed between the bit line structures 16 and the substrate 11. In some embodiments, the bit line structures 16 are electrically connected to the substrate 11 through the contact structures 13. In some embodiments, each of the contact structures 13 extends along a Z direction, substantially perpendicular to the X direction and the Y direction. In some embodiments, each of the contact structures 13 includes a conductive material 131 and a spacer 132 surrounding the conductive material 131. In some embodiments, the contact structures 13 extend across the word line structure WL. In some embodiments, the contact structures 13 penetrate the portion 121 of the isolation 12. In some embodiments, the contact structures 13 penetrate the portion 122 of the isolation 12. In some embodiments, the conductive material 131 includes metal or other suitable materials. In some embodiments, the spacer 132 includes one or more of oxide, nitride and oxynitride. In some embodiments, the spacer 132 includes silicon oxide.

In some embodiments, the semiconductor structure 1 further includes a contact layer 14 disposed between each of the bit line structures 16 and the contact structures 13. In some embodiments, the contact layer 14 includes a tuning layer 141 and a transition layer 142. In some embodiments, a material of the tuning layer 141 is adjusted depending on different applications for a desired electrical resistance. In some embodiments, the tuning layer 141 includes indium tin oxide (ITO). In some embodiments, a material of the transition layer 142 is adjusted depending on different applications for minimizing an interfacial barrier between different materials. In some embodiments, the transition layer 142 includes titanium nitride (TiN).

In some embodiments, the semiconductor structure 1 further includes a plurality of landing pads 15 disposed between the bit line structures 16 and the contact structures 13. In some embodiments, the landing pads 15 are disposed between the bit line structures 16 and the contact layer 14. In some embodiments, the bit line structures 16 are electrically connected to the substrate 11 through the landing pads 15. In some embodiments, the landing pads 15 include tungsten.

In some embodiments, each of the bit line structures 16 is disposed on one of the landing pads 15 and an adjacent portion of the portion 122 of the isolation 12. In some embodiments, each of the bit line structures 16 includes a metal layer 161, a metal nitride layer 162, an oxide layer 163 and a nitride layer 164 stacked in sequence over the substrate 11. In some embodiments, the metal layer 161 includes tungsten. In some embodiments, the metal nitride layer 162 includes titanium nitride or other suitable metal-containing materials. In some embodiments, the oxide layer 163 includes silicon oxide. In some embodiments, the nitride layer 164 functions as a protection layer or a hard layer. In some embodiments, the nitride layer 164 includes silicon nitride.

The dielectric layer 17 is disposed over the bit line structures 16. In some embodiments, the dielectric layer 17 is disposed between and over the bit line structures 16. In some embodiments, the dielectric layer 17 may be single layer (not shown). In some embodiments, the dielectric layer 17 may be a multi-layered structure as shown in FIG. 1. In some embodiments, a material of the dielectric layer 17 is selected from one or more silanes. In some embodiments, the dielectric layer 17 includes a first dielectric sublayer 171 and a second dielectric sublayer 172. In some embodiments, a thickness of a vertical portion of the first dielectric sublayer 171 surrounding sidewalls of the bit line structures 16 is less than a thickness of a horizontal portion of the first dielectric sublayer 171 on tops of the bit line structures 16. In some embodiments, the thickness of the vertical portion of the first dielectric sublayer 171 is in a range of 1 to 7 nanometers. In some embodiments, the thickness of the horizontal portion of the first dielectric sublayer 171 is in a range of 20 to 60 nanometers. In some embodiments, the first dielectric sublayer 171 is formed by a chemical vapor deposition (CVD). In some embodiments, a deposition rate of the first dielectric sublayer 171 is greater than 70 angstroms per second. In some embodiments, the deposition rate of the first dielectric sublayer 171 is greater than 120 angstroms per second. In some embodiments, a material of the first dielectric sublayer 171 is selected from one or more silanes. In some embodiments, the first dielectric sublayer 171 includes silane ($SiH_4$).

In some embodiments, the first dielectric sublayer 171 surrounds the bit line structures 16 and forms seals at or above tops of the bit line structures 16 to define a plurality of air gaps AG between the bit line structures 16. In some embodiments, each of the air gaps AG is elongated and extends perpendicular to the substrate 11 along the Z direction from the cross-sectional view as shown in FIG. 1. In some embodiments, each of the air gaps AG extends along the Y direction between the bit line structures 16 from the top view as shown in FIG. 2. In some embodiments, the first dielectric sublayer 171 encircles the air gaps AG. For ease of illustration, an air gap AG1 of the air gaps AG between a first bit line 16a and a second bit line 16b of the bit line structures 16 is described in detail in the following description. The conditions and parameters of the air gap AG1 can be applied to each of the plurality of air gaps AG. Similarly, in the following description, for a purpose of simplicity, the conditions and parameters of the first bit line 16a or the second bit line 16b can be applied to each of the plurality of bit line structures 16.

In some embodiments, a height H1 of the air gap AG1 is greater than or equal to a height H16 of the first bit line 16a or the second bit line 16b. In some embodiments, a width W1 of the air gap AG1 is in a range of 8 to 36 nanometers. In some embodiments, a top of the air gap AG1 is disposed between a top of the first dielectric sublayer 171 and a top of the first bit line 16a along the Z direction. In some embodiments, a vertical distance D1 between the top of the air gap AG1 and a bottom of the first bit line 16a is greater than or equal to the height H16 of the first bit line 16a or the second bit line 16b. In some embodiments, the air gap AG1 is at least disposed between the top of the first bit line 16a and the top of the first dielectric sublayer 171. In some embodiments, a bottom of the air gap AG1 is disposed at a same level as the bottom of the first bit line 16a. In some embodiments, the bottom of the air gap AG1 is disposed lower than the bottom of the first bit line 16a. In some embodiments, the air gap AG1 is disposed at least between the bottom of the first bit line 16a and a bottom of the adjacent landing pad 15. In some embodiments, the air gap AG1 is disposed at least between a first landing pad under the first bit line 16a and a second landing pad under the second bit line 16b. In some embodiments, the air gap AG1 is disposed at least between a pair of the portions 122 of the isolation 12.

In some embodiments, the second dielectric sublayer 172 is disposed over the first dielectric sublayer 171. In some embodiments, the second dielectric sublayer 172 covers an entirety of the first dielectric sublayer 171. In some embodiments, the second dielectric sublayer 172 is separated from the bit line structures 16 by the first dielectric sublayer 171. In some embodiments, a thickness of the second dielectric sublayer 172 is greater than a thickness of the first dielectric sublayer 171. In some embodiments, the second dielectric sublayer 172 includes a dielectric material different from that of the first dielectric sublayer 171. In some embodiments, the second dielectric sublayer 172 is formed by a chemical vapor deposition (CVD). In some embodiments, a deposition rate of the second dielectric sublayer 172 is greater than 50 angstroms per second. In some embodiments, the deposition rate of the second dielectric sublayer 172 is greater than 90 angstroms per second. In some embodiments, the deposition rate of the second dielectric sublayer 172 is less than the deposition rate of the first dielectric sublayer 171. In some embodiments, a material of the second dielectric sublayer 172 is selected from silanes. In some embodiments, the second dielectric sublayer 172 includes one or more of silane ($SiH_4$) and tetraethoxy silane (TEOS). In some embodiments, the second dielectric sublayer 172 and the first dielectric sublayer 171 include different silanes.

In some embodiments, the RDL 19 is disposed over the dielectric layer 17. The RDL 19 provides electrical connections to the bit line structures 16 and to the word line structure WL. The RDL 19 may include a plurality of insulating layers 192 and a plurality of conductive layers 191 disposed in and surrounded by the plurality of insulating layers 192. In some embodiments, the conductive layers 191 of the RDL 19 include a plurality of conductive components and a plurality of conductive vias formed in layers and electrically connected to each other to form an electrical network. The bit line structures 16 and the word line structure WL are electrically connected to other devices or other electrical components through the conductive components and conductive vias of the conductive layers 191 of the RDL 19. The insulating layers 192 serve to electrically isolate the conductive components and/or conductive vias to ensure different electrical paths.

Figure 3:
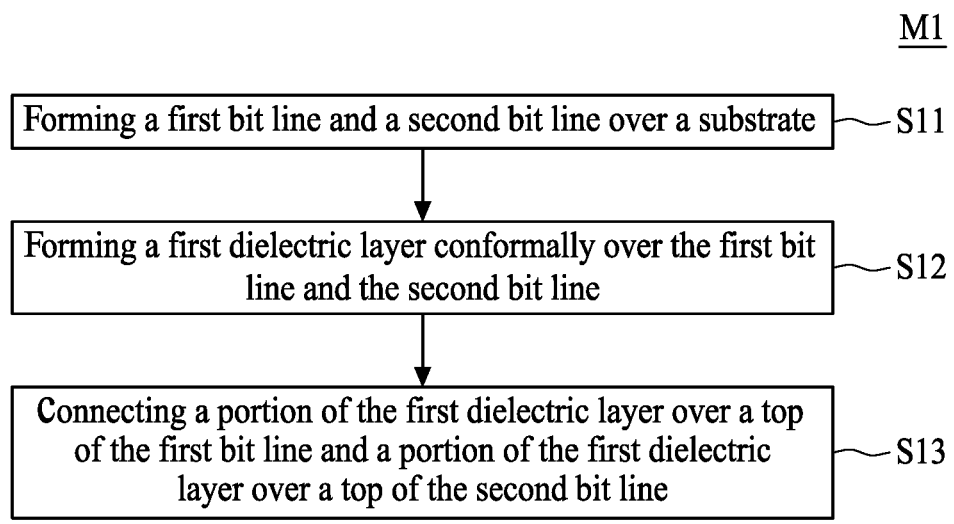
FIG. 3 is a flow diagram illustrating a method of manufacturing a semiconductor structure in accordance with some embodiments of the present disclosure.

FIG. 3 is a flow diagram of a method M1 for manufacturing a semiconductor structure 2, which is similar to the semiconductor structure 1 shown in FIG. 1 and FIG. 2. The method M1 includes: (S11) forming a first bit line and a second bit line over a substrate; (S12) forming a first dielectric layer conformally over the first bit line and the second bit line; and (S13) connecting a portion of the first dielectric layer over a top of the first bit line to a portion of the first dielectric layer over a top of the second bit line. In some embodiments, the semiconductor structure 1 is also manufactured according to the method M1.

Figure 4:
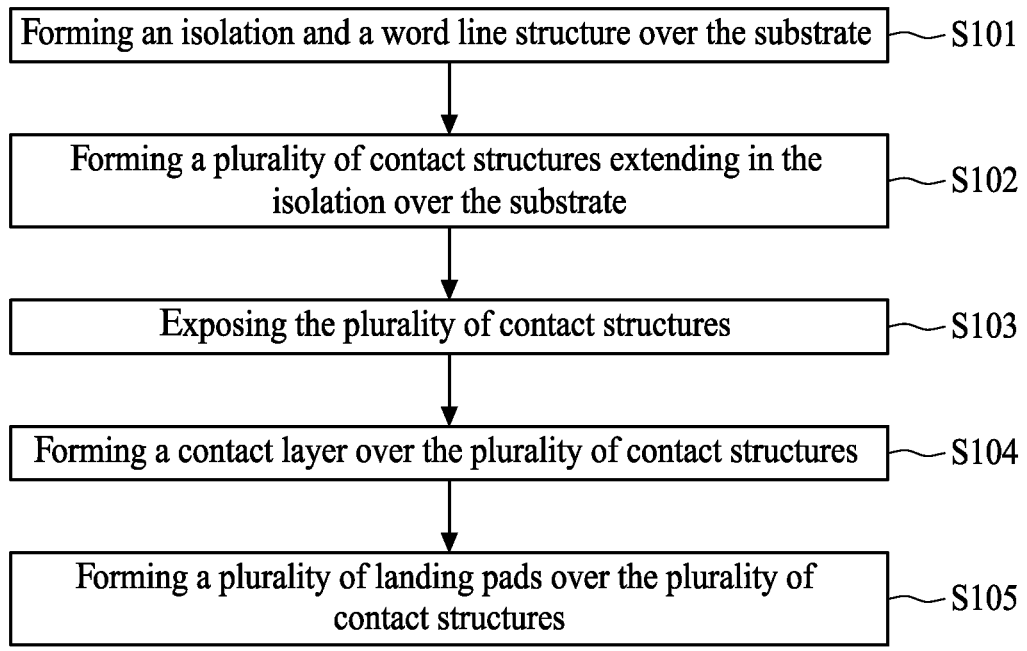
FIG. 4 is a flow diagram illustrating alternative operations of the method of manufacturing a semiconductor structure in accordance with some embodiments of the present disclosure.

FIG. 4 is a flow diagram of a further operation S10 of the method M1 performed prior to the operation S11 in accordance with some embodiments. The operation S10 may include several steps: (S101) forming an isolation and a word line structure over the substrate; (S102) forming a plurality of contact structures extending in the isolation over the substrate; (S103) exposing the plurality of contact structures; (S104) forming a contact layer over the plurality of contact structures; and (S105) forming a plurality of landing pads over the plurality of contact structures.

Figure 5:
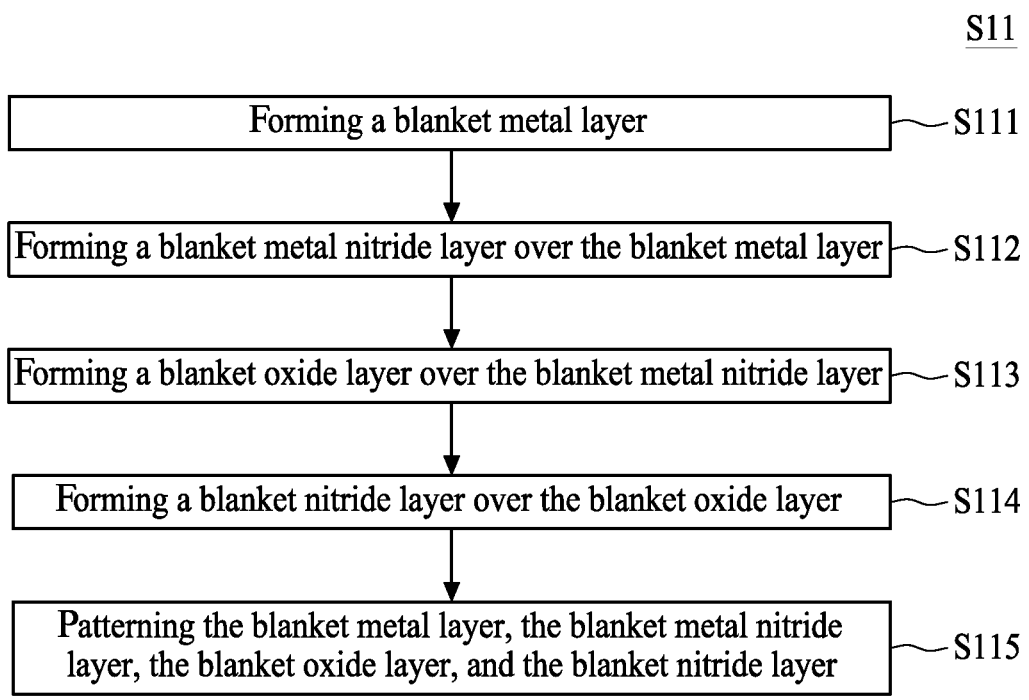
FIG. 5 is a flow diagram illustrating alternative steps of an operation of the method of manufacturing a semiconductor structure in accordance with some embodiments of the present disclosure.

FIG. 5 is a flow diagram of the operation S11 in accordance with some embodiments of the present disclosure. In some embodiments, the operation S11 includes several steps: (S111) forming a blanket metal layer; (S112) forming a blanket metal nitride layer over the blanket metal layer; (S113) forming a blanket oxide layer over the blanket metal nitride layer; (S114) forming a blanket nitride layer over the blanket oxide layer; and (S115) patterning the blanket metal layer, the blanket metal nitride layer, the blanket oxide layer, and the blanket nitride layer.

Figure 6:
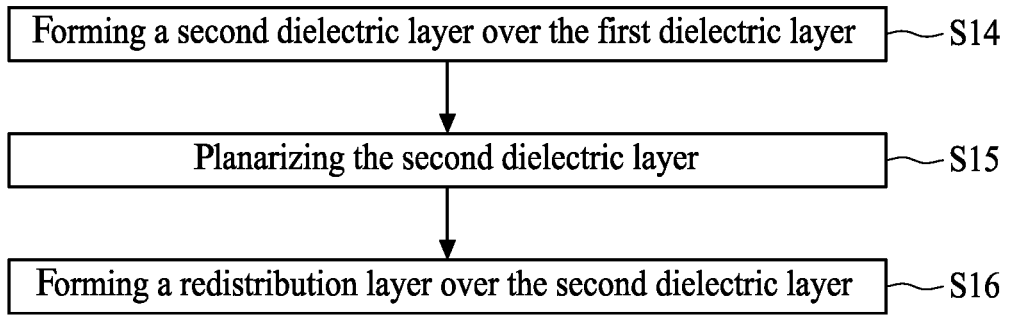
FIG. 6 is a flow diagram illustrating alternative operations of the method of manufacturing a semiconductor structure in accordance with some embodiments of the present disclosure.

FIG. 6 is a flow diagram of further operations of the method M1 performed after the operation S13 in accordance with some embodiments. In some embodiments, the method M1 may further include one or more of the following operations: (S14) forming a second dielectric layer over the first dielectric layer; (S15) planarizing the second dielectric layer; and (S16) forming a redistribution layer over the second dielectric layer.

In order to further illustrate concepts of the present disclosure, various embodiments are provided below. For a purpose of clarity and simplicity, reference numbers of elements with same or similar functions are repeatedly used in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not conflicted.

Figure 7:
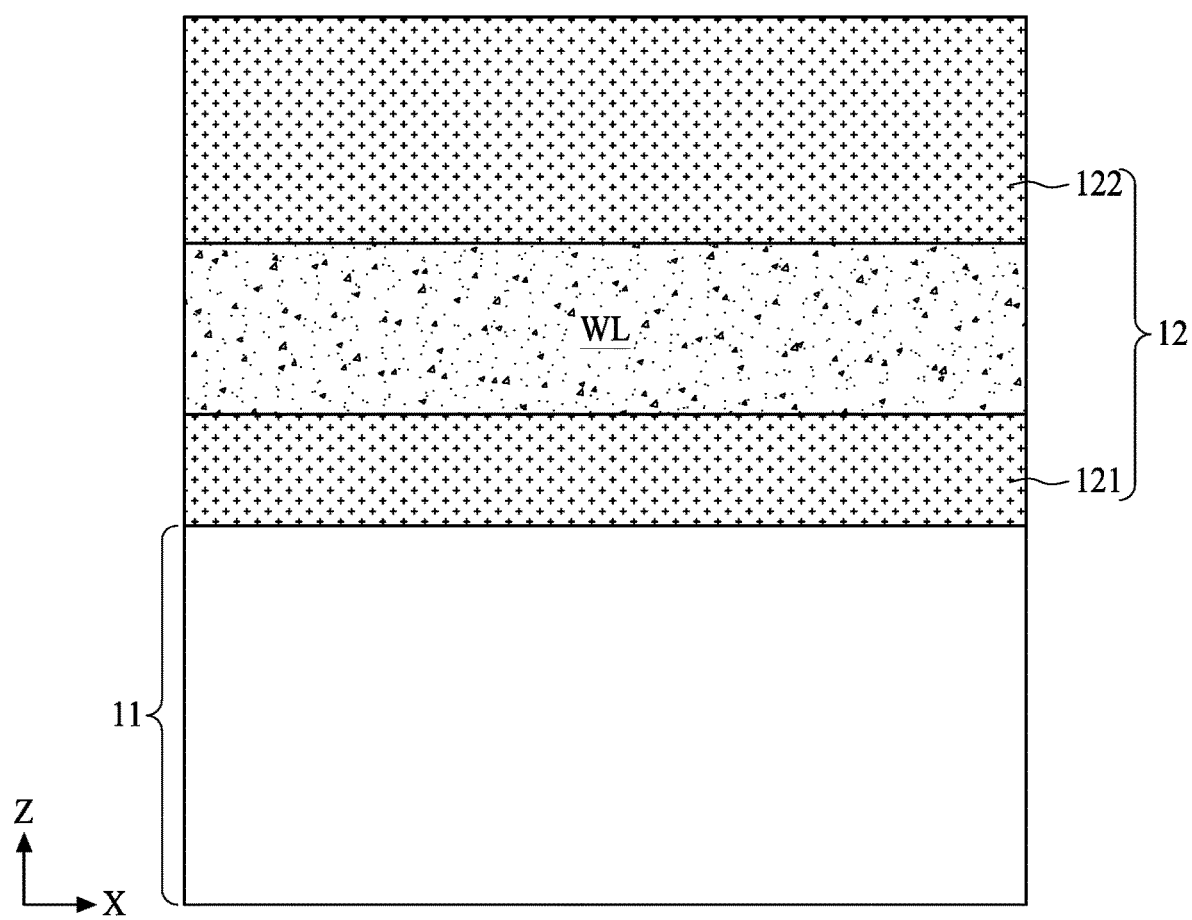
FIGS. 7 to 21 illustrate cross-sectional views of intermediate stages in formation of a semiconductor structure in accordance with some embodiments of the present disclosure.

Referring to FIG. 7, in accordance with some embodiments of the present disclosure and the step S101 of the operation S10 of the method M1, an isolation 12 and a word line structure WL are formed over a substrate 11. In some embodiments, a portion 121 of the isolation 12 is formed, and then the word line structure WL is formed on the portion 121. In some embodiments, a portion 122 of the isolation 12 is formed after the formation of the word line structure WL. In some embodiments, the isolation 12 is formed by one or more depositions. In some embodiments, the isolation 12 includes oxide. A conventional structure of word line can be applied, and no further illustration of the formation of the word line structure WL is provided herein.

Figure 8:
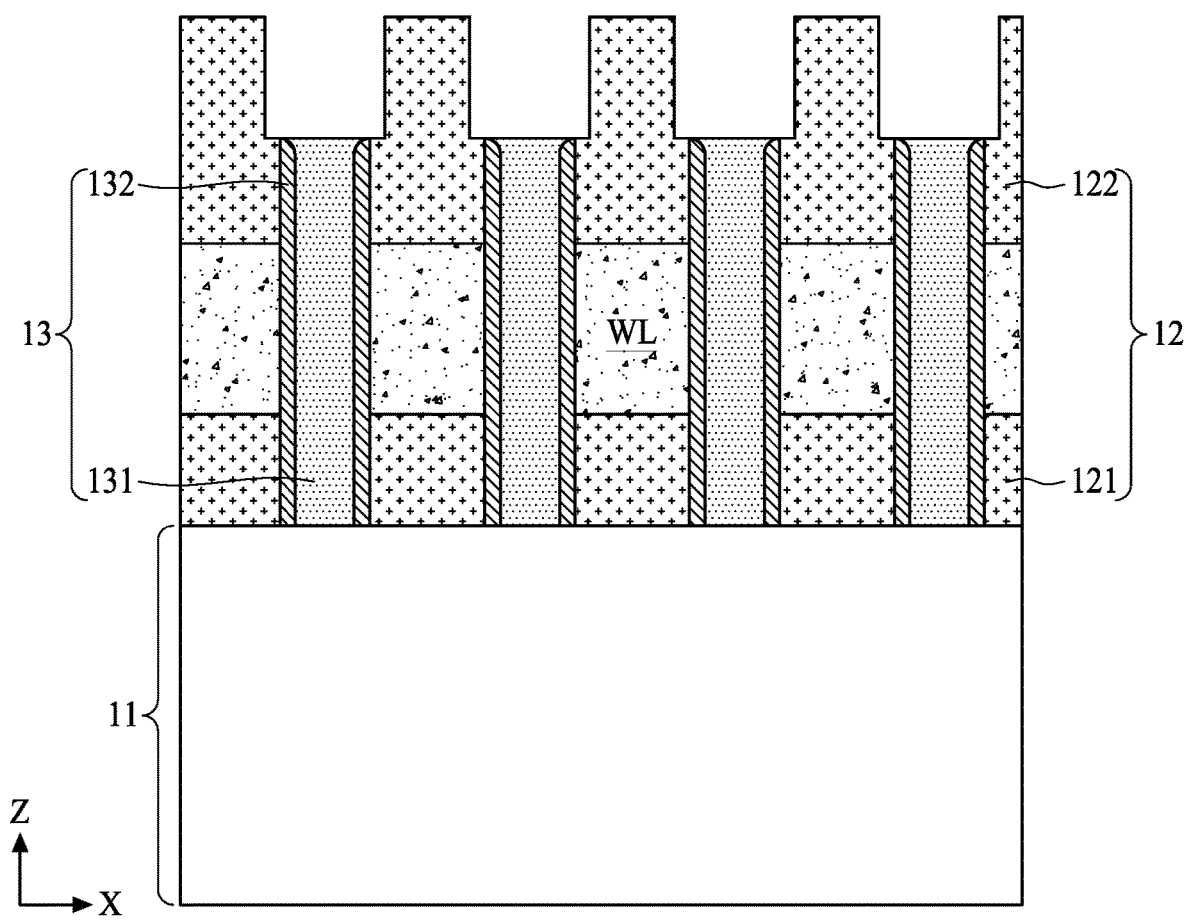

Referring to FIG. 8, in accordance with some embodiments of the present disclosure and the steps S102 and S103 of the operation S10 of the method M1, a plurality of contact structures 13 are formed over the substrate 11, and each of the contact structures 13 extends in the isolation 12. In some embodiments, each of the contact structures 13 elongates perpendicular to the isolation 12. In some embodiments, the contact structures 13 are formed after the formation of the word line structure WL and the portion 121 of the isolation 12. In some embodiments, the isolation 12 is patterned, thereby removing portions of the isolation 12. The contact structures 13 are then formed in spaces previously occupied by the removed portions of the isolation 12. In some embodiments, portions of the word line structure WL are also removed, and the contact structures 13 penetrate and extend across the word line structure WL. In some embodiments, each of the contact structures 13 includes a conductive material 131 and a spacer 132. The spacer 132 is formed between the conductive material 131 and the isolation 12. In some embodiments, the spacer 132 electrically isolates the word line structure WL and the conductive material 131. In some embodiments, the spacer 132 is formed prior to forming of the conductive material 131. In some embodiments, the conductive material 131 is formed prior to the forming of the spacer 132. In some embodiments, the spacer 132 is formed by a conformal deposition. In some embodiments, the conductive material 131 is formed by a tungsten filling process. In some embodiments, a top portion of the portion 122 of the isolation 12 is removed to expose the contact structures 13.

Figure 9:
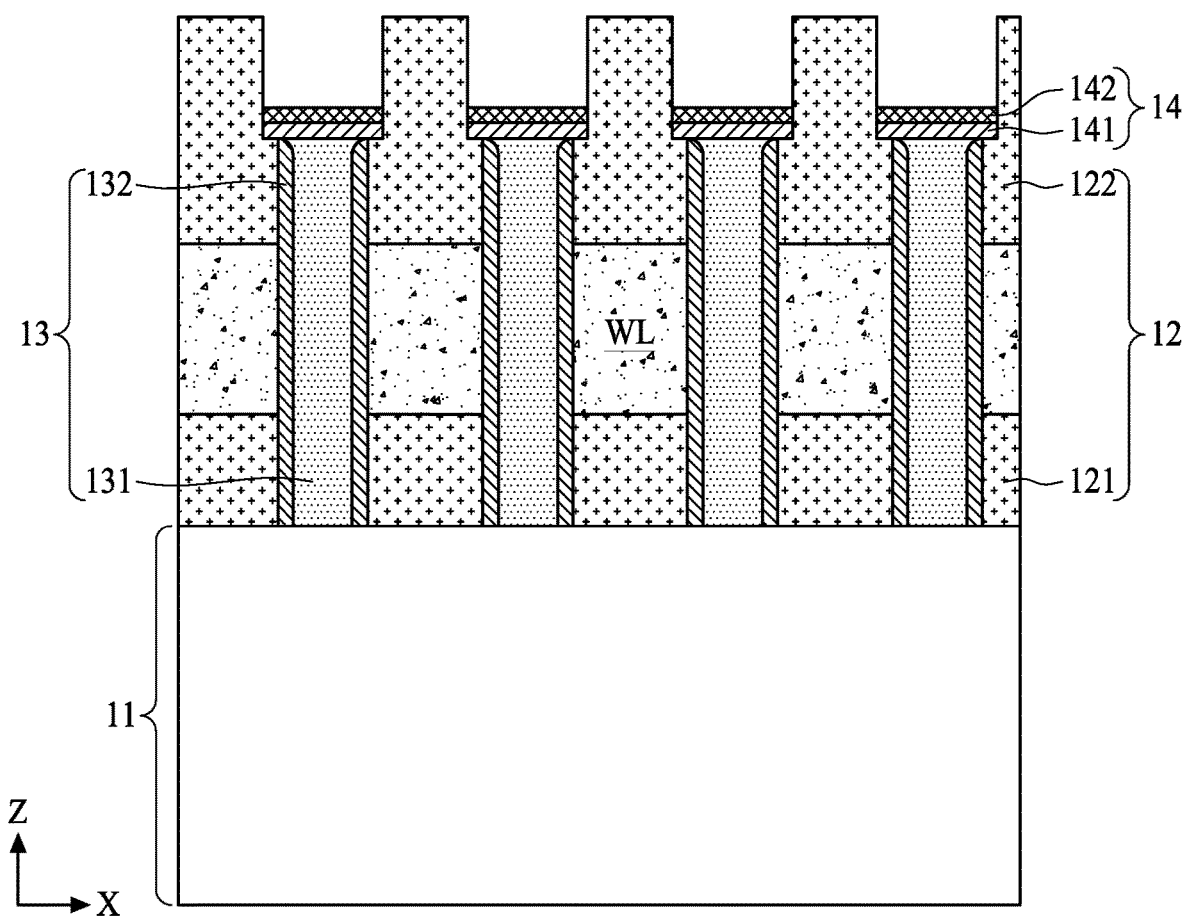

Referring to FIG. 9, in accordance with some embodiments of the present disclosure and the step S104 of the operation S10 of the method M1, a contact layer 14 is formed on a top of each of the contact structures 13. In some embodiments, the contact layer 14 is a single metal-containing layer. In some embodiments, the contact layer 14 is a multi-layered structure. In some embodiments, the contact layer 14 includes a tuning layer 141 and a transition layer 142. In some embodiments, the tuning layer 141 is formed prior to a formation of the transition layer 142. In some embodiments, the tuning layer 141 is in physical contact with a top of the conductive material 131. In some embodiments, a blanket tuning layer and a blanket transition layer are sequentially formed and then are patterned to form the tuning layer 141 and the transition layer 142. In some embodiments, two depositions are sequentially performed to form the blanket tuning layer and the blanket transition layer. In some embodiments, the tuning layer 141 includes indium tin oxide (ITO). In some embodiments, the transition layer 142 includes titanium nitride (TiN).

Figure 10:
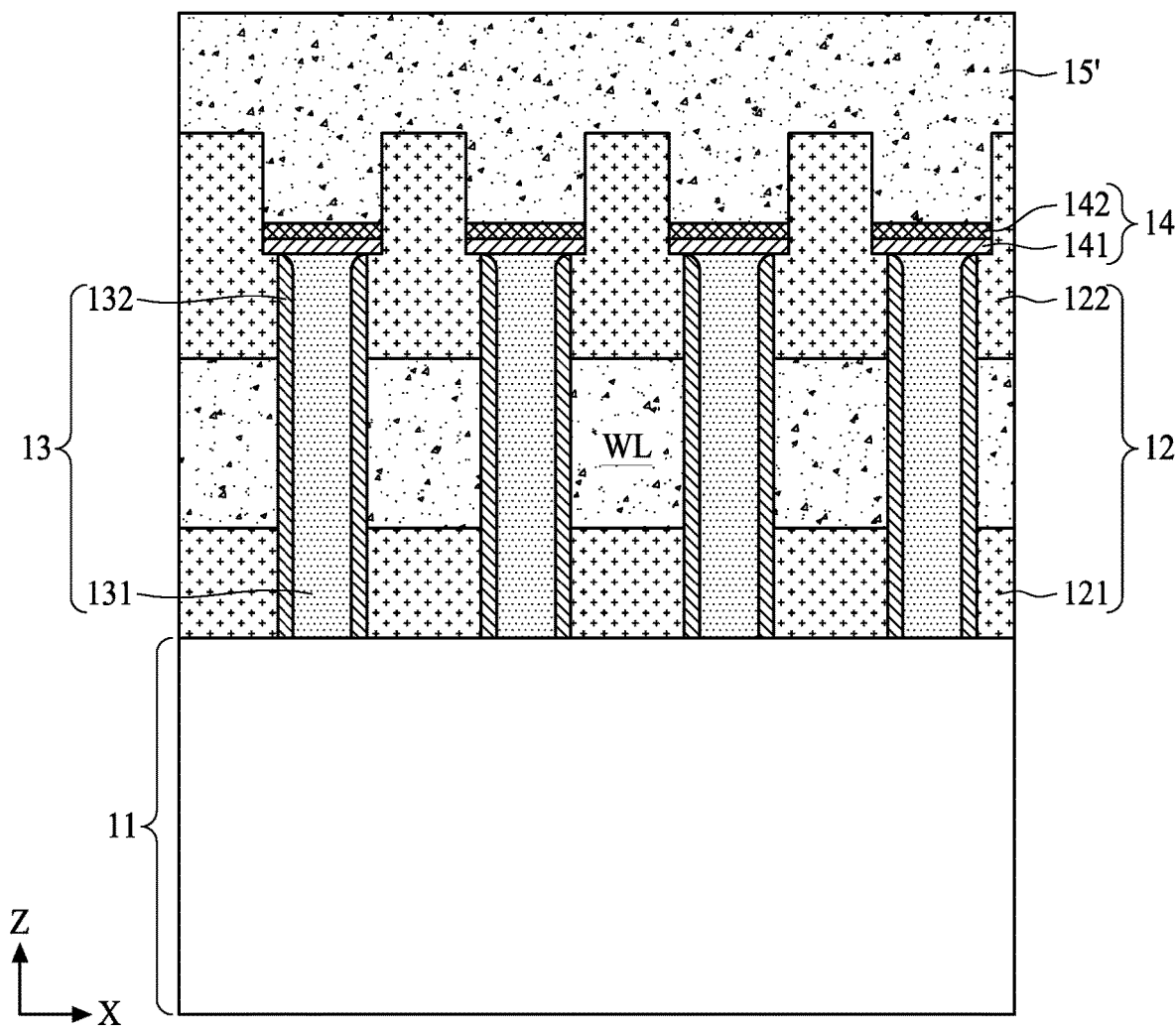
Figure 11:
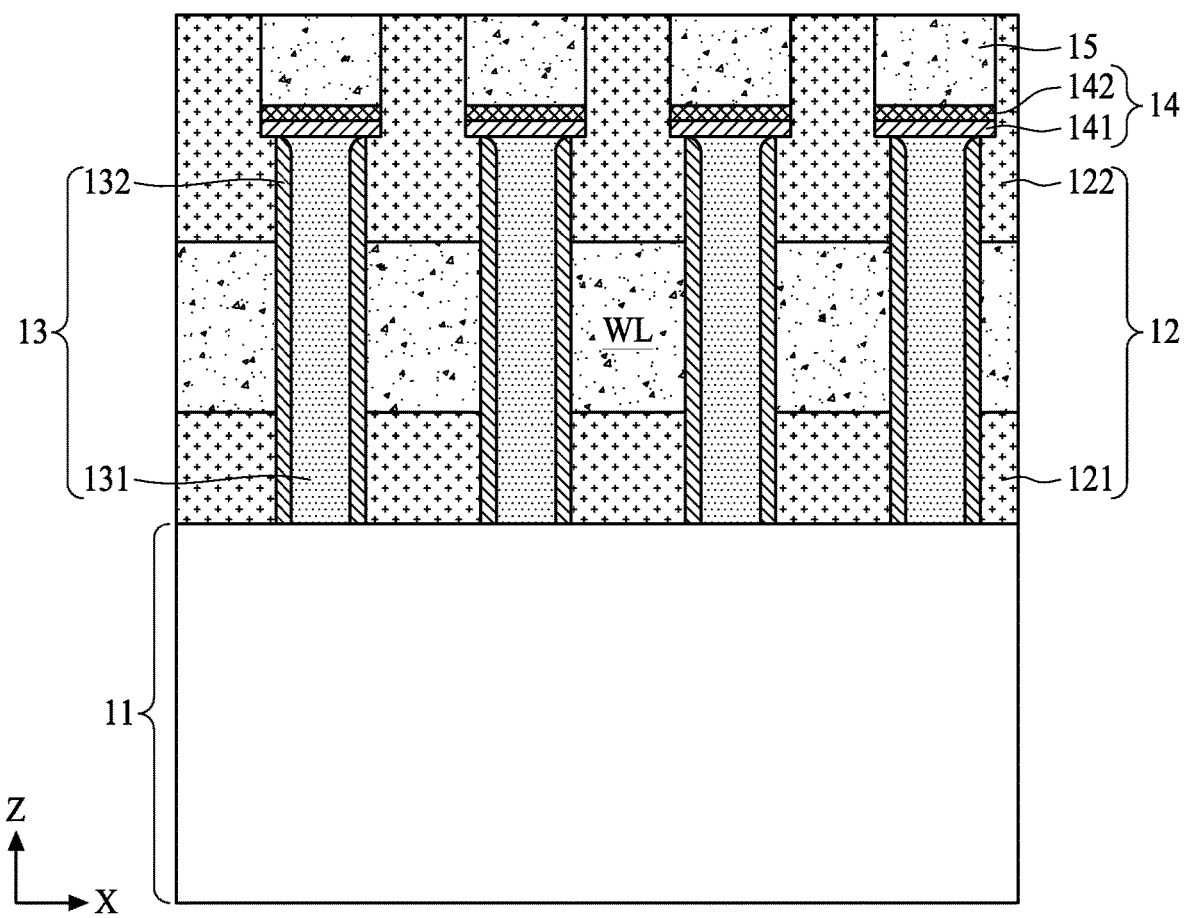

Referring to FIGS. 10 to 11, in accordance with some embodiments of the present disclosure and the step S105 of the operation S10 of the method M1, a plurality of landing pads 15 is formed over the plurality of contact structures 13. In some embodiments, the formation of the landing pads 15 includes several sub-steps. In some embodiments, a landing layer 15' is formed over the contact layer 14 and the isolation 12 as shown in FIG. 10. In some embodiments, the landing layer 15' is in physical contact with the contact layer 14. In some embodiments, a deposition is performed to form the landing layer 15'. In some embodiments, the landing layer 15' includes tungsten. A planarization is then performed on the landing layer 15' as shown in FIG. 11. In some embodiments, the planarization stops upon an exposure of the isolation 12. In some embodiments, the planarization includes a chemical mechanical polishing (CMP).

Figure 12:
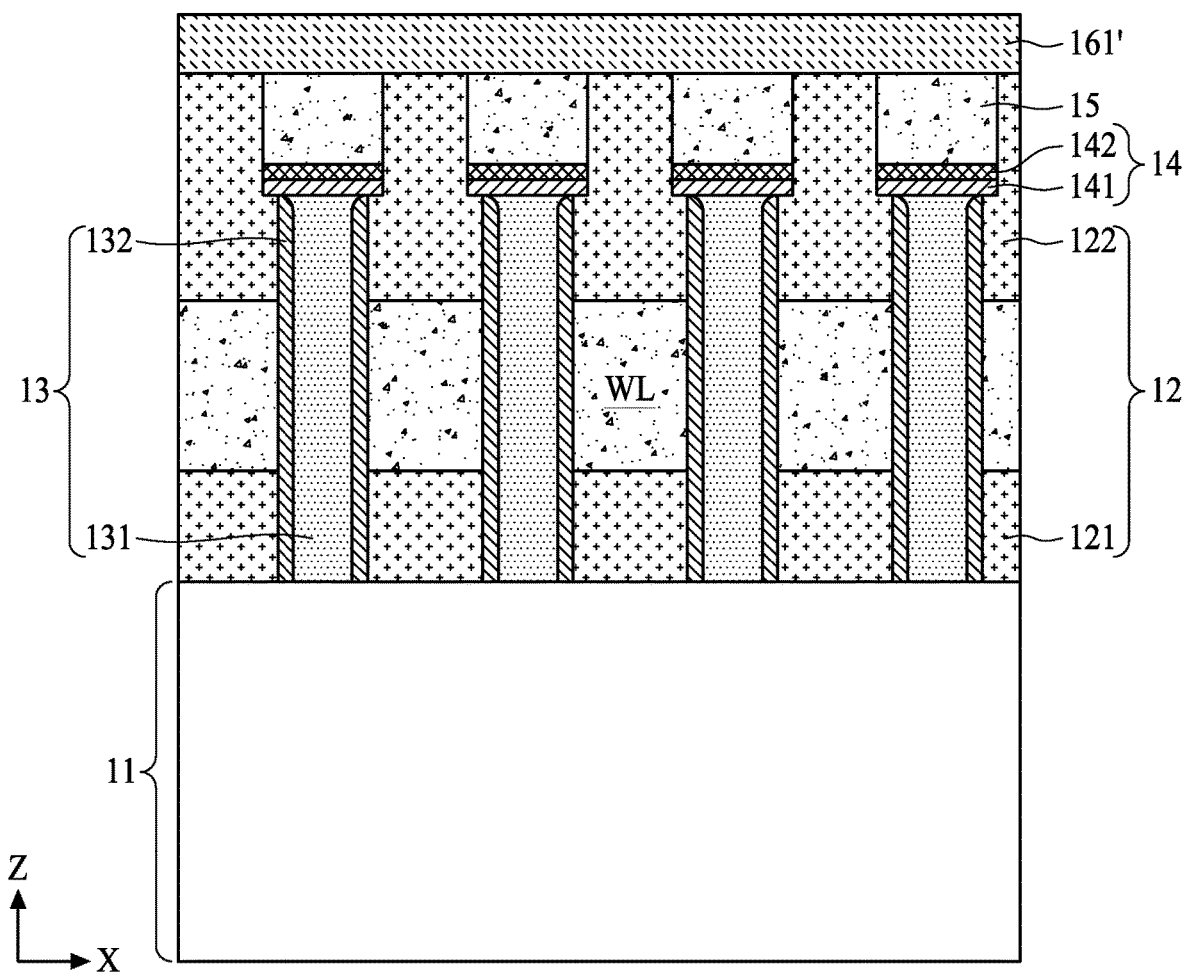
Figure 13:
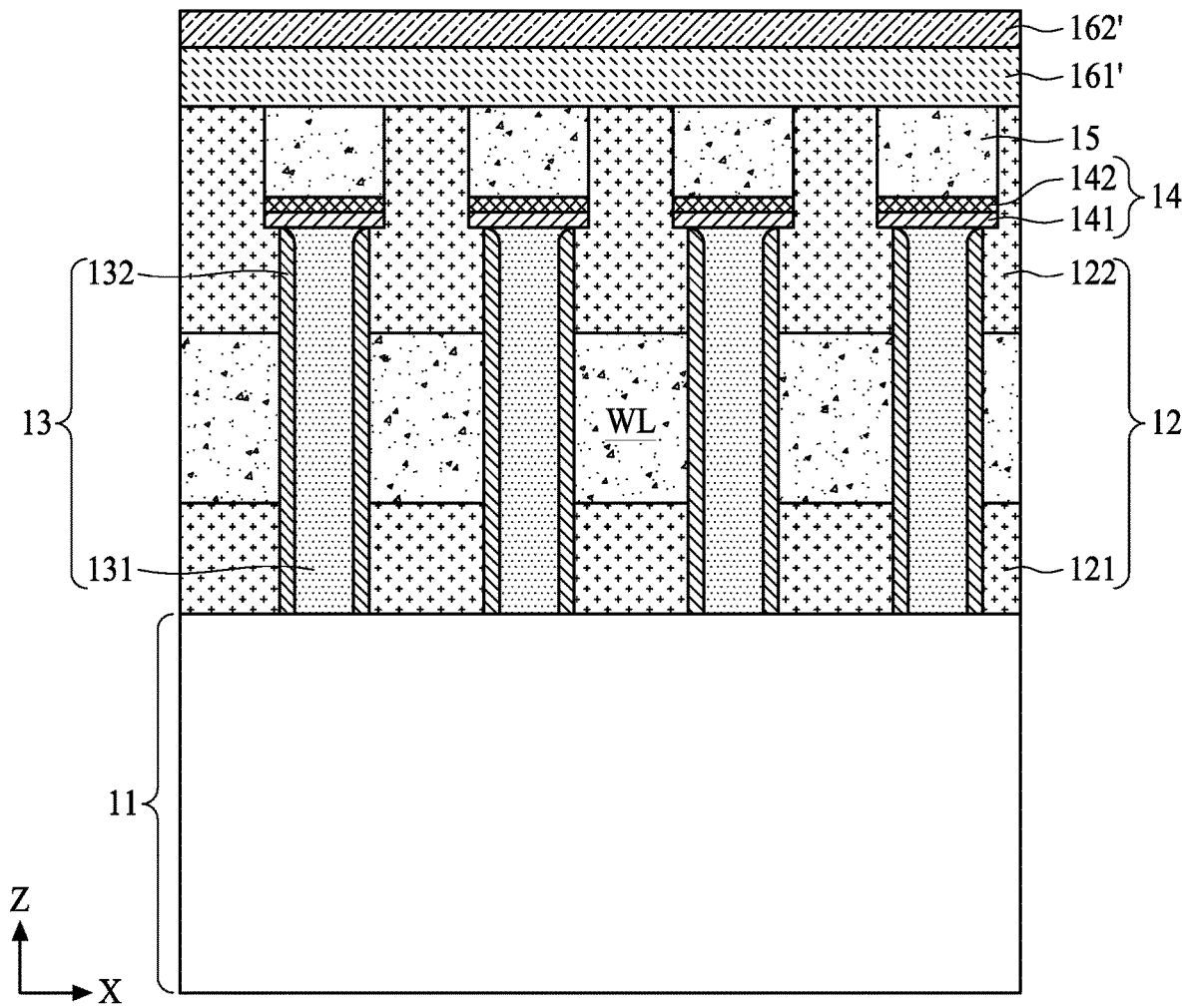
Figure 14:
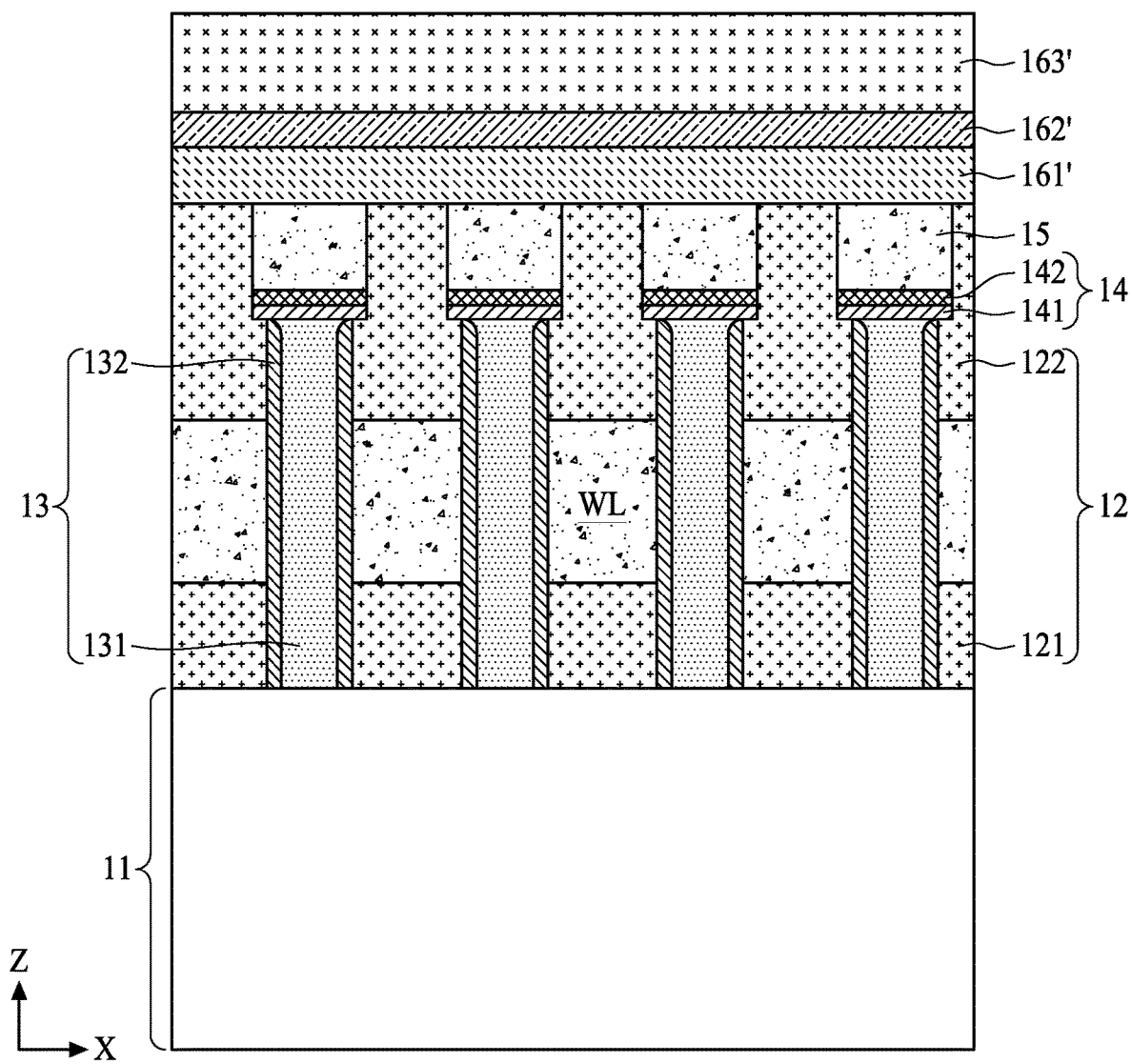
Figure 15:
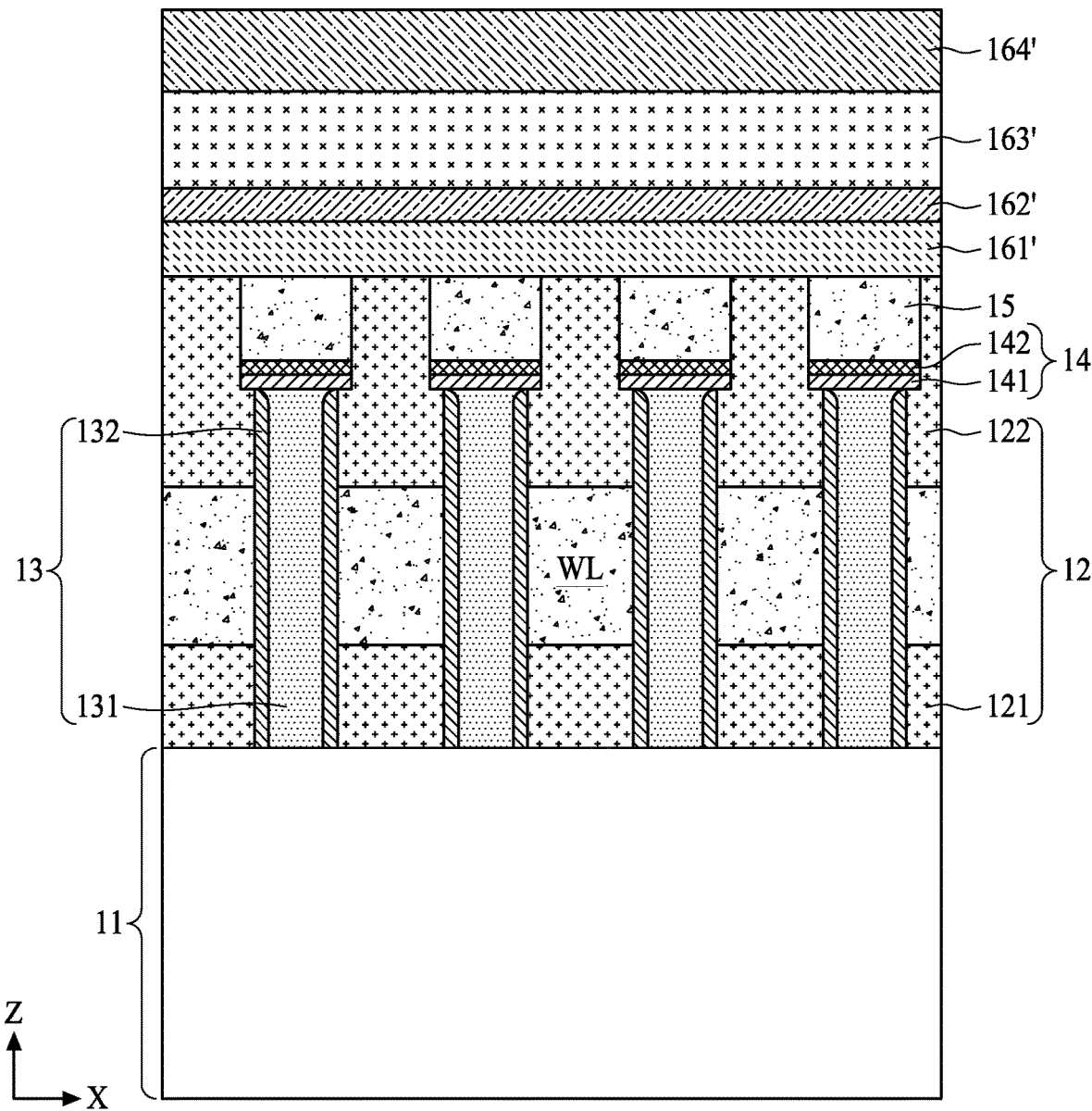

Referring to FIGS. 12 to 17, in accordance with some embodiments of the present disclosure and the operation S11 of the method M1, a plurality of bit line structures 16 is formed on the isolation 12 and the landing pads 15 the over the substrate 11. The operation S11 may include the steps S111 to S115 as shown in FIG. 5. Referring to FIG. 12, in accordance with some embodiments of the present disclosure and the step S111 of the operation S11 of the method M1, a blanket metal layer 161' is formed on the isolation 12 and the landing pads 15 over the substrate 11. In some embodiments, the blanket metal layer 161' is formed by a deposition. In some embodiments, the blanket metal layer 161' includes tungsten or other suitable metals. Referring to FIG. 13, in accordance with some embodiments of the present disclosure and the step S112 of the operation S11 of the method M1, a blanket metal nitride layer 162' is formed on the blanket metal layer 161'. In some embodiments, the blanket metal nitride layer 162' is formed by a deposition. In some embodiments, the blanket metal nitride layer 162' includes titanium nitride or other suitable metal-containing materials. Referring to FIG. 14, in accordance with some embodiments of the present disclosure and the step S113 of the operation S11 of the method M1, a blanket oxide layer 163' is formed on the blanket metal nitride layer 162'. In some embodiments, the blanket oxide layer 163' is formed by a deposition. In some embodiments, the blanket oxide layer 163' can be silicon oxide, oxynitride, or other suitable dielectric or oxygen-containing materials. Referring to FIG. 15, in accordance with some embodiments of the present disclosure and the step S114 of the operation S11 of the method M1, a blanket nitride layer 164' is formed on the blanket oxide layer 163'. In some embodiments, the blanket nitride layer 164' is formed by a deposition. In some embodiments, the blanket nitride layer 164' includes silicon nitride, oxynitride, or other suitable dielectric materials.

Figure 16:
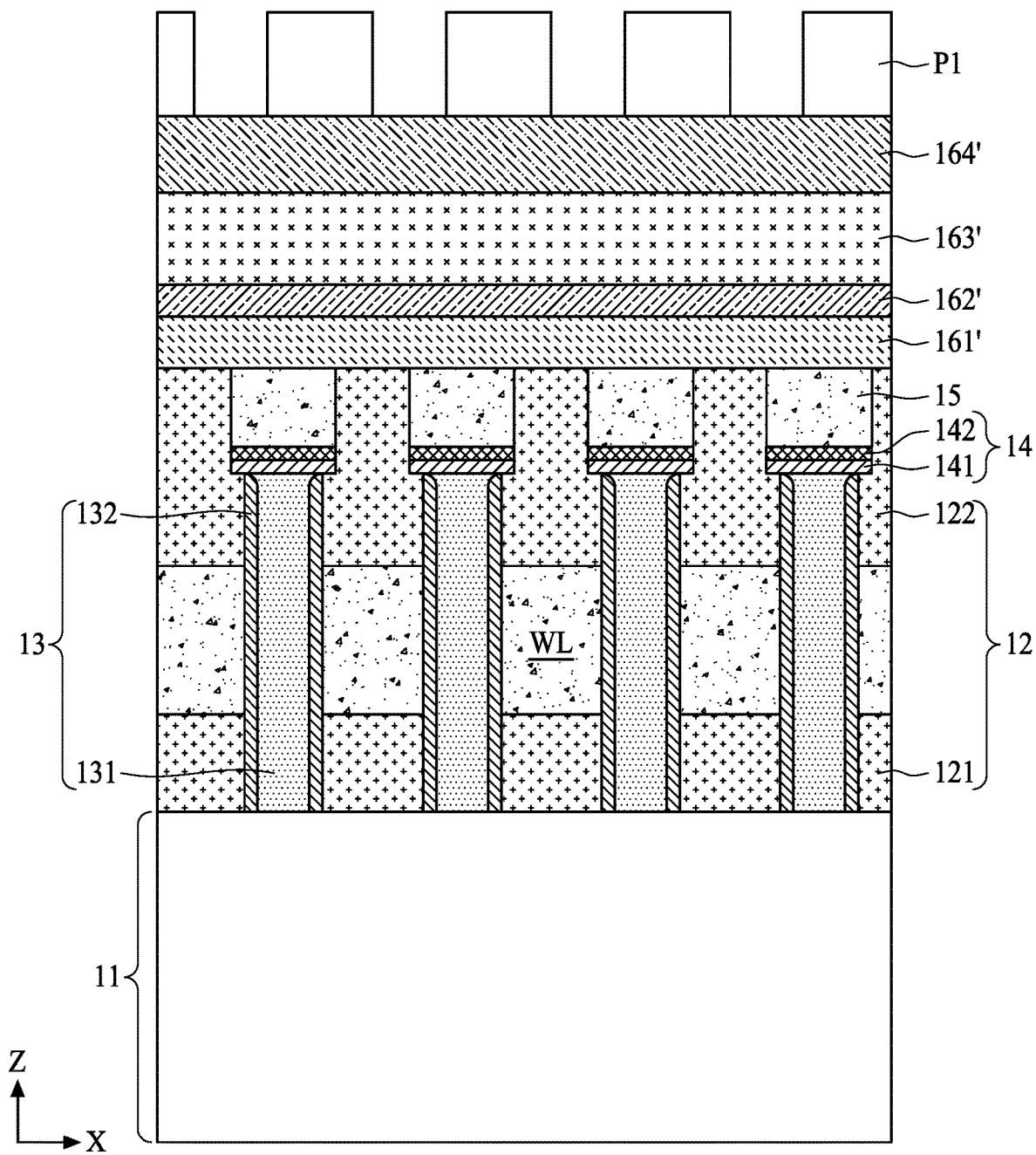
Figure 17:
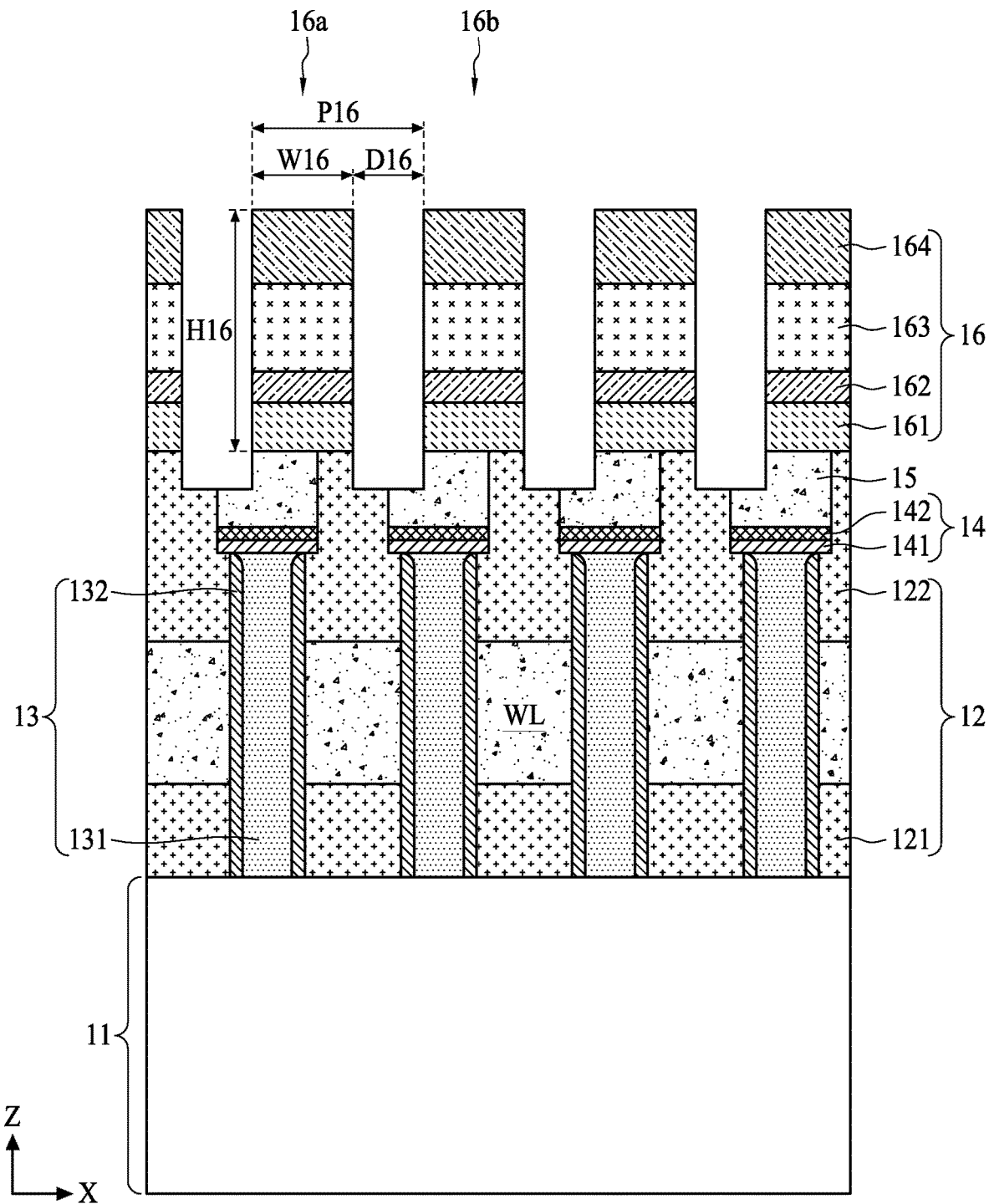

Referring to FIGS. 16 to 17, in accordance with some embodiments of the present disclosure and the step S115 of the operation S11 of the method M1, the blanket nitride layer 164', the blanket oxide layer 163', the blanket metal nitride layer 162' and the blanket metal layer 161' are patterned to form a plurality of bit line structures 16. In some embodiments, the step S115 further includes several sub-steps. As shown in FIG. 16, a patterned layer P1 is formed over the blanket nitride layer 164' in order to define the plurality of bit line structures 16. In some embodiments, a blanket etching is performed to remove portions of the blanket nitride layer 164', the blanket oxide layer 163', the blanket metal nitride layer 162' and the blanket metal layer 161'. The plurality of bit line structures 16 are formed, and each of the bit line structures 16 includes a metal layer 161, a metal nitride layer 162, an oxide layer 163 and a nitride layer 164 stacked in sequence on the landing pad 15 and the isolation 12 over the substrate 11. In some embodiments, the nitride layer 164 functions as a protection layer or a hard layer to prevent damage to portions of the bit line structures 16 below the nitride layer 164 during subsequent manufacturing processes. In some embodiments, the patterned layer P1 is used as a mask in the blanket etching. The patterned layer P1 may be a photoresist layer or another type of mask layer, and the portions of the blanket nitride layer 164', the blanket oxide layer 163', the blanket metal nitride layer 162' and the blanket metal layer 161' exposed through the patterned layer P1 are removed. In some embodiments, portions of the landing pads 15 are selectively removed by the blanket etching. In some embodiments, portions of the isolation 12 adjacent to the removed portions of the landing pads 15 are selectively removed by the blanket etching as shown in FIG. 17.

A first bit line 16a and a second bit line 16b adjacent to the first bit line 16a of the bit line structures 16 are used as exemplary embodiments in the following description. The conditions and parameters of the first bit line 16a or the second bit line 16b can be applied to each of the plurality of bit line structures 16. A height H16 of the first bit line 16 measured from a bottom of the metal layer 161 to a top of the nitride layer 164 can be adjusted depending on different applications and specifications. In some embodiments, the height H16 is substantially equal to a total thickness of the metal layer 161, the metal nitride layer 162, the oxide layer 163 and the nitride layer 164. In some embodiments, a width W16 of the first bit line 16a is less than a distance D16 between the first bit line 16a and the second bit line 16b. In some embodiments, a pitch P16 is substantially equal to a total of the width W16 and the distance D16. Ranges of the width W16, the distance D16 and the pitch P16 are described above, and details are not repeated herein.

Figure 18:
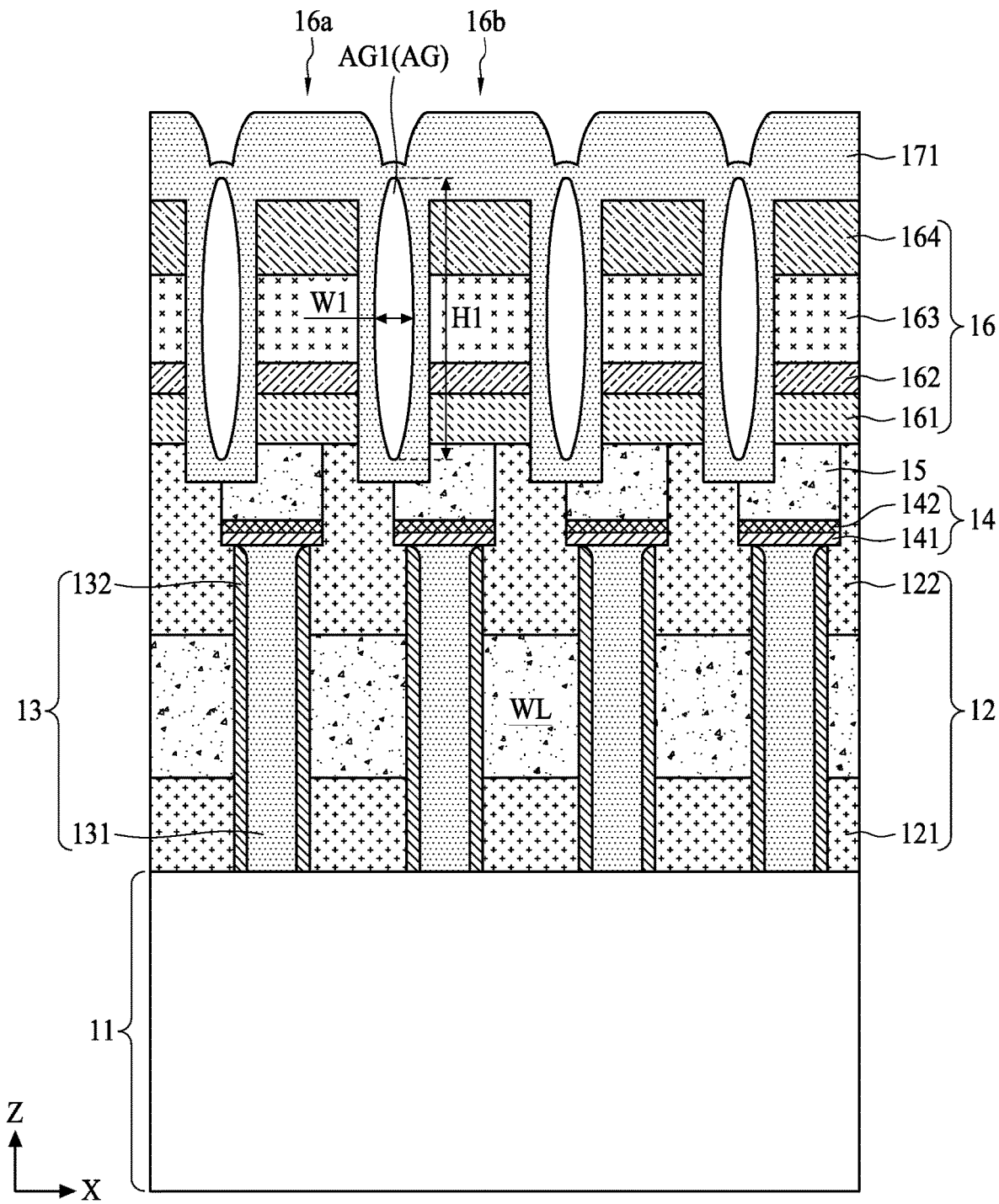

Referring to FIG. 18, in accordance with some embodiments of the present disclosure and the operations S12 to S13 of the method M1, a first dielectric sublayer 171 is formed over and conformal to the bit line structures 16. The first dielectric sublayer 171 surrounds sidewalls of the bit line structures 16, and is disposed on exposed portions of the isolation 12 and exposed portions of the landing pads 15. In some embodiments, the first dielectric sublayer 171 is formed on and between the landing pads 15 along a horizontal direction or the X direction. In some embodiments, the first dielectric sublayer 171 is formed on and between portions of the isolation 12 along the horizontal direction or the X direction. In some embodiments, a chemical vapor deposition (CVD) is performed to form the first dielectric sublayer 171. In some embodiments, a deposition rate of the first dielectric sublayer 171 is greater than 70 angstroms per second. In some embodiments, the deposition rate of the first dielectric sublayer 171 is greater than 120 angstroms per second. In some preferred embodiments, a dielectric material with a good overhead property is selected. The dielectric material with the good overhead property can result in a good sealing result between the bit line structures 16. In some embodiments, a material of the first dielectric sublayer 17 is selected from one or more members of the silane family. In some embodiments, the first dielectric sublayer 171 includes one or more of silane (SiH$_4$) and tetraethoxy silane (TEOS). In some embodiments, silane exhibits a better overhead performance than TEOS.

Still referring to FIG. 18, portions of the first dielectric sublayer 171 at or above tops of the bit line structures 16 are connected to form a plurality of air gaps AG. More specifically, portions of the first dielectric sublayer 171 at corners of the bit line structures 16 are connected due to the good overhead properties, thereby defining the air gaps AG. In some embodiments, the air gaps AG are encircled and sealed by the first dielectric sublayer 171. An air gap AG1 of the air gaps AG between the first bit line 16a and the second bit line 16b is illustrated as an example, and conditions and parameters of the air gap AG1 can be applied to other air gaps of the plurality of air gaps AG. A top of the air gap AG1 is at least above a top of the oxide layer 163 of the first bit line 16a or the second bit line 16b. In some embodiments, the top of the air gap AG1 is at a level of the top of the first bit line 16a or the top of the second bit line 16b. In some embodiments, the top of the air gap AG1 is above the top of the first bit line 16a or the top of the second bit line 16b. In other words, a height H1 of the air gap AG1 depends on the overhead property and a conformity of the material of the first dielectric sublayer 171. A better overhead property of the material can provide a greater height H1, and better conformity of the material may lead to a lesser height H1. The height H1 of the air gap AG1 can be adjusted depending on different applications and/or different manufacturing processes. In some embodiments, the height H1 of the air gap AG1 is greater than or equal to the height H16 of the first bit line 16a or the second bit line 16b. In some embodiments, a width W1 of the air gap AG1 is in a range of 8 to 36 nanometers.

Figure 19:
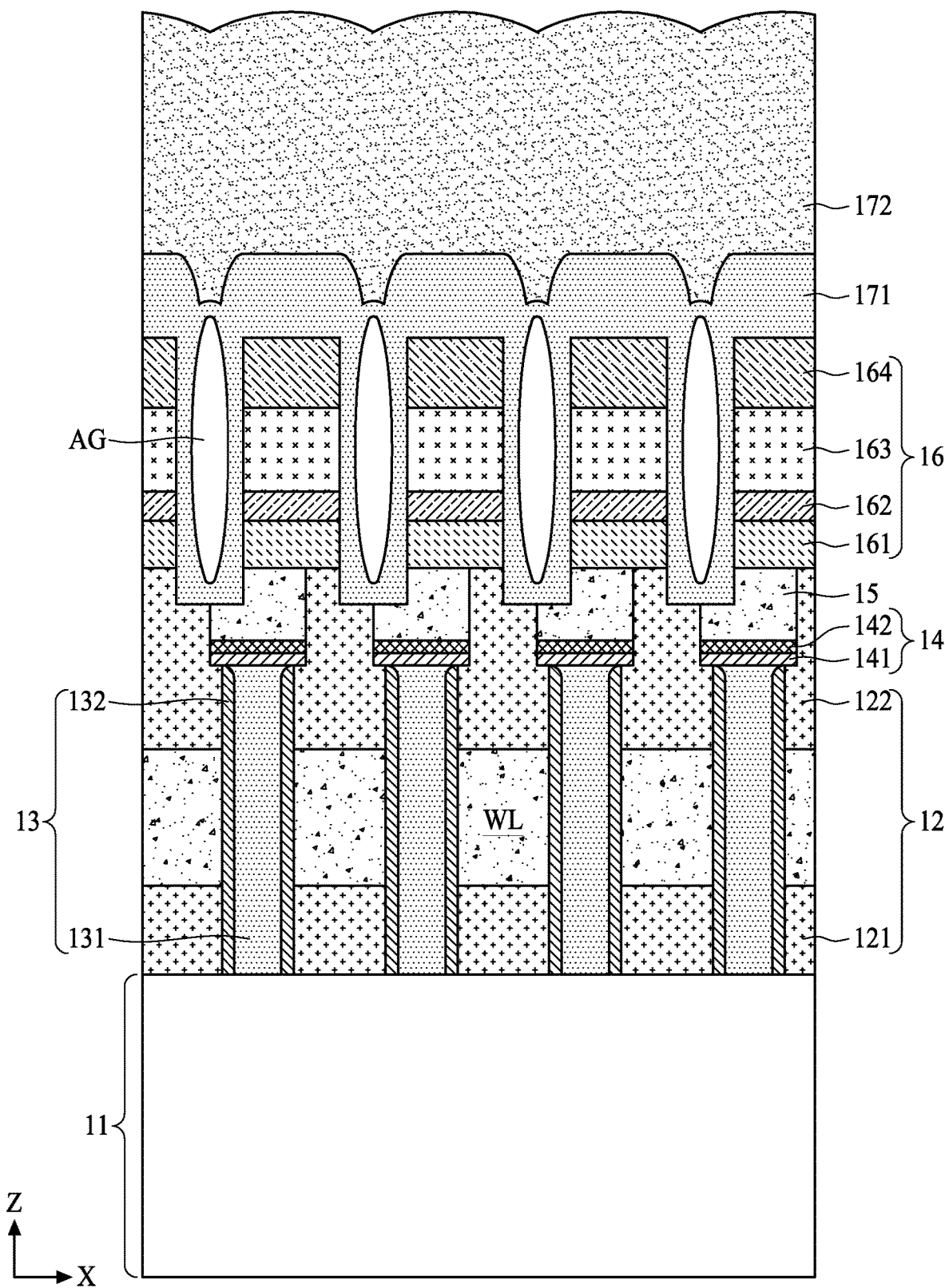

Referring to FIG. 19, in accordance with some embodiments of the present disclosure and the operation S14 of the method M1, a second dielectric sublayer 172 is formed over the first dielectric sublayer 171. In some embodiments, a second dielectric sublayer 172 is formed by a blanket deposition over the first dielectric sublayer 171. In some embodiments, the second dielectric sublayer 172 at this stage has an undulating top surface corresponding to a profile of a top surface of the first dielectric sublayer 171. In some embodiments, the second dielectric sublayer 172 includes a dielectric material different from that of the first dielectric sublayer 171. In some embodiments, the second dielectric sublayer 172 is formed by a chemical vapor deposition (CVD). In some embodiments, a deposition rate of the second dielectric sublayer 172 is greater than 50 angstroms per second. In some embodiments, the deposition rate of the second dielectric sublayer 172 is greater than 90 angstroms per second. In some embodiments, the deposition rate of the second dielectric sublayer 172 is less than the deposition rate of the first dielectric sublayer 171. In some embodiments, the first dielectric sublayer 171 has a better overhead property than that of the second dielectric sublayer 172. In some embodiments, a material of the second dielectric sublayer 172 is selected from the silane family. In some embodiments, the second dielectric sublayer 172 includes one or more of silane (SiH$_4$) and tetraethoxy silane (TEOS). In some embodiments, the second dielectric sublayer 172 and the first dielectric sublayer 171 include different silanes.

Figure 20:
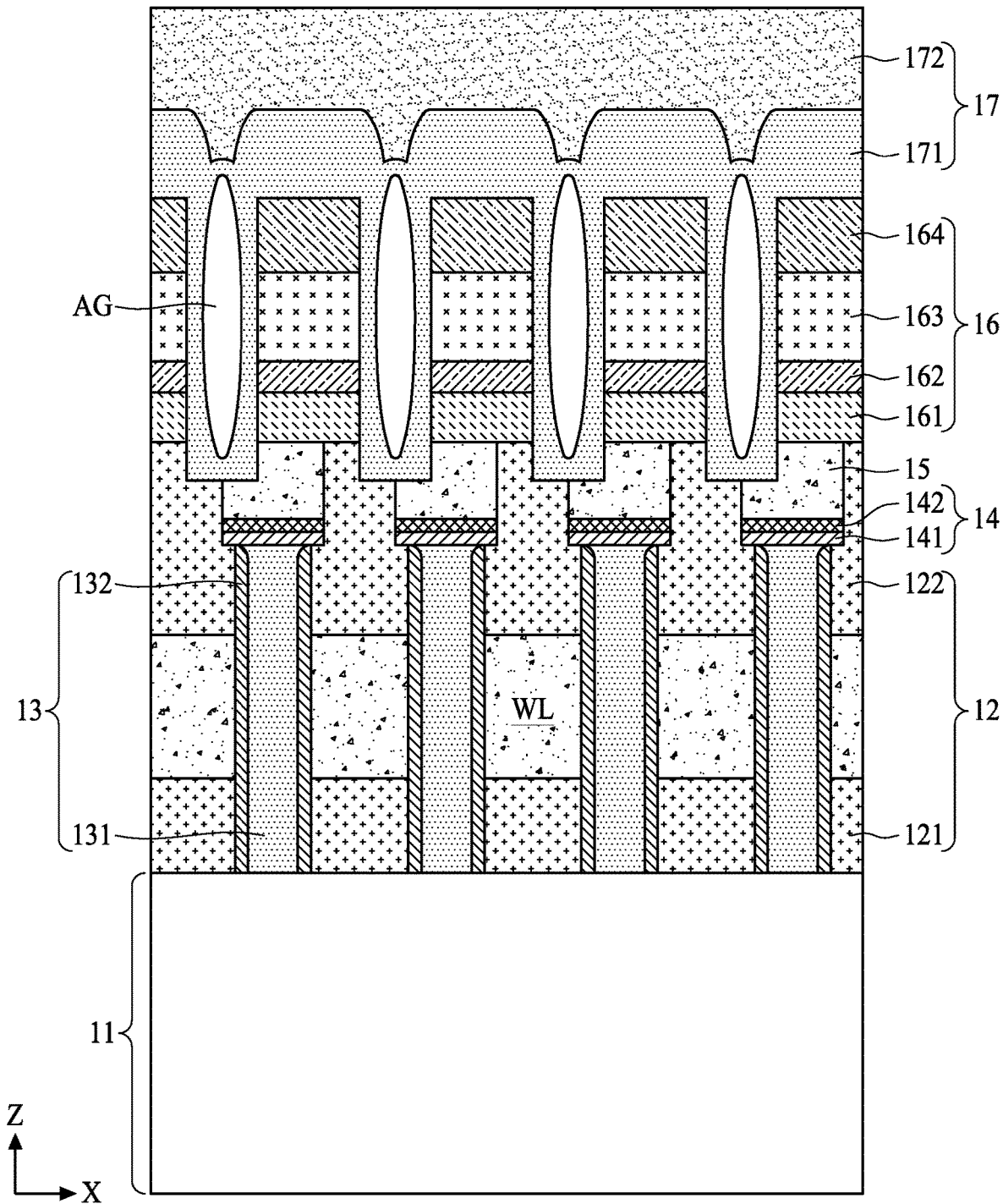

Referring to FIG. 20, in accordance with some embodiments of the present disclosure and the operation S15 of the method M1, a planarization is performed to remove a portion of the second dielectric sublayer 172. The second dielectric sublayer 172 at this stage has a planar top surface. A thickness of the second dielectric sublayer 172 at this stage is greater than a thickness of the first dielectric sublayer 171. In some embodiments, portions of the second dielectric sublayer 172 are disposed between portions of the first dielectric sublayer 171 along the horizontal direction or the X direction. In some embodiments, the first dielectric sublayer 171 and the second dielectric sublayer 172 together define a dielectric layer 17. In some embodiments, the dielectric layer 17 may include more dielectric sublayers. In some embodiments, a nitride layer is further formed over the planarized second dielectric sublayer 172 (not shown) for moisture prevention.

Figure 21:
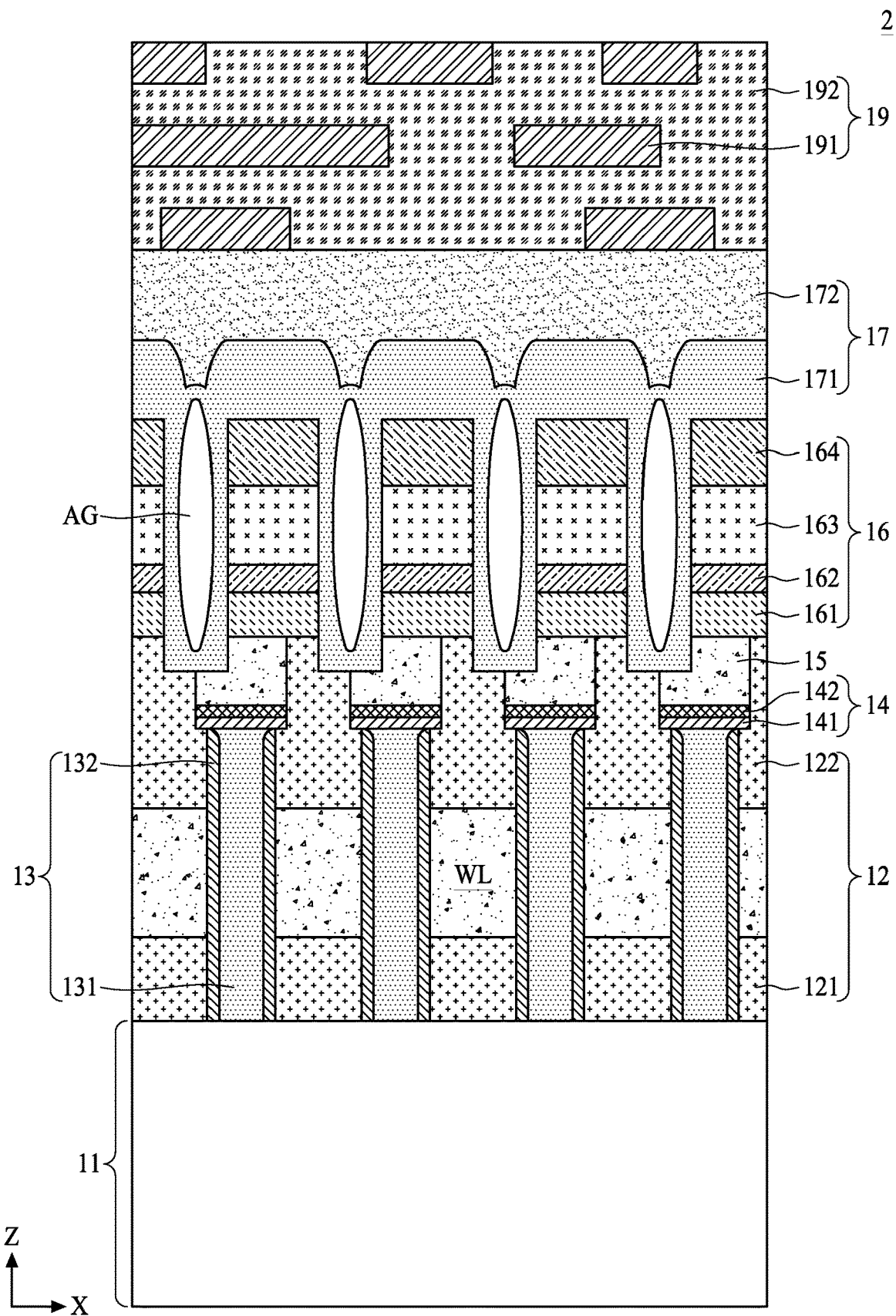

Referring to FIG. 21, in accordance with some embodiments of the present disclosure and the operation S16 of the method M1, a redistribution layer (RDL) 19 is formed over the second dielectric sublayer 172 of the dielectric layer 17.

In some embodiments, an insulating layer 192 is formed by a deposition. In some embodiments, portions of the insulating layer 192 are removed, and a conductive layer 191 is formed at the removed portions of the insulating layer 192. The RDL 19 may include several layers of the conductive layer 191 surrounded by the insulating layer 192. In some embodiments, the conductive layers 191 are electrically connected by several layers of conductive vias (not shown) disposed alternately between the conductive layers 191. A conventional method of formation of the RDL 19 can be applied, and the disclosure is not limited herein.

Figure 22:
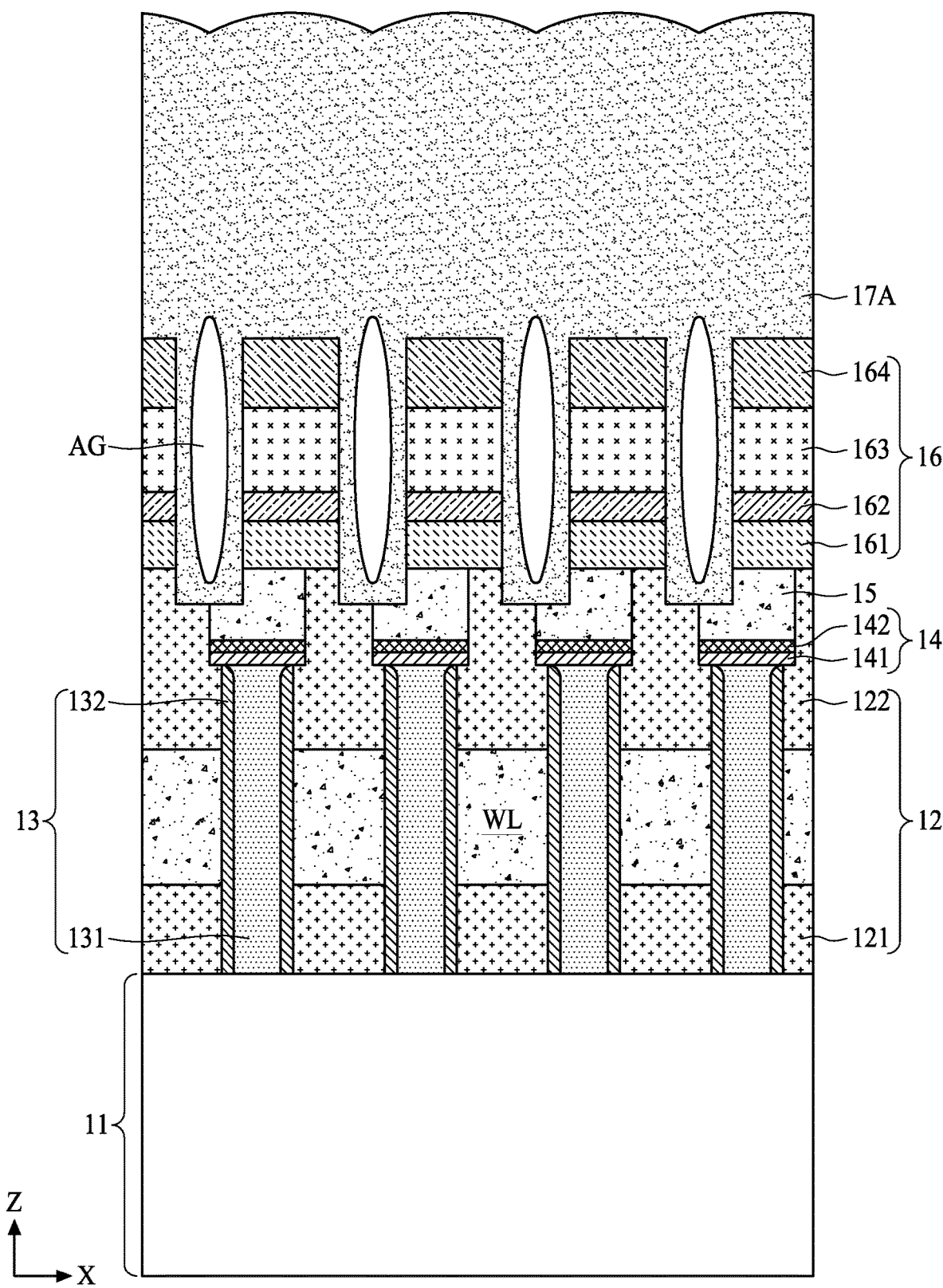
FIGS. 22 to 24 illustrate cross-sectional views of intermediate stages in the formation of a semiconductor structure in accordance with some embodiments of the present disclosure.
Figure 23:
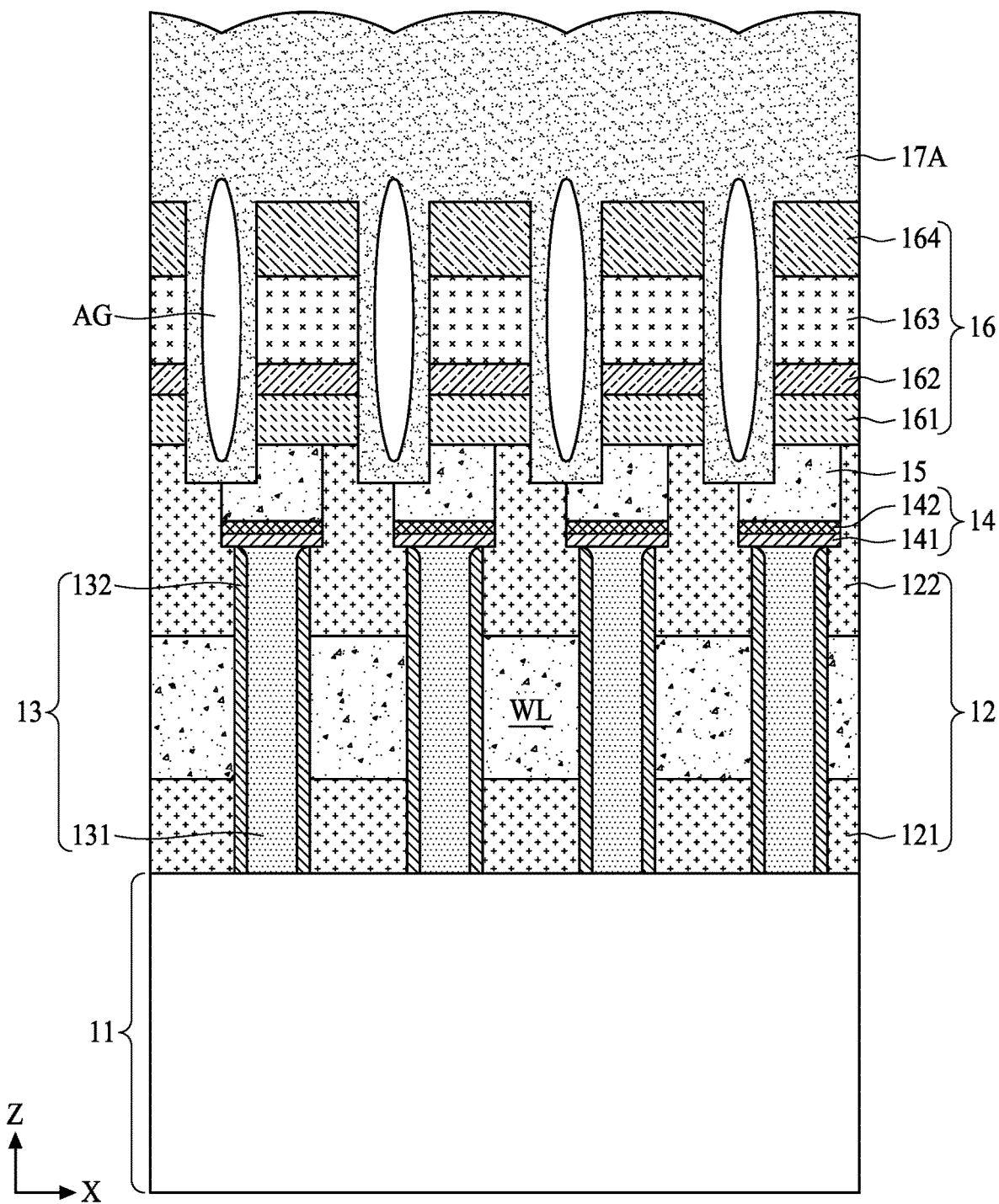
Figure 24:
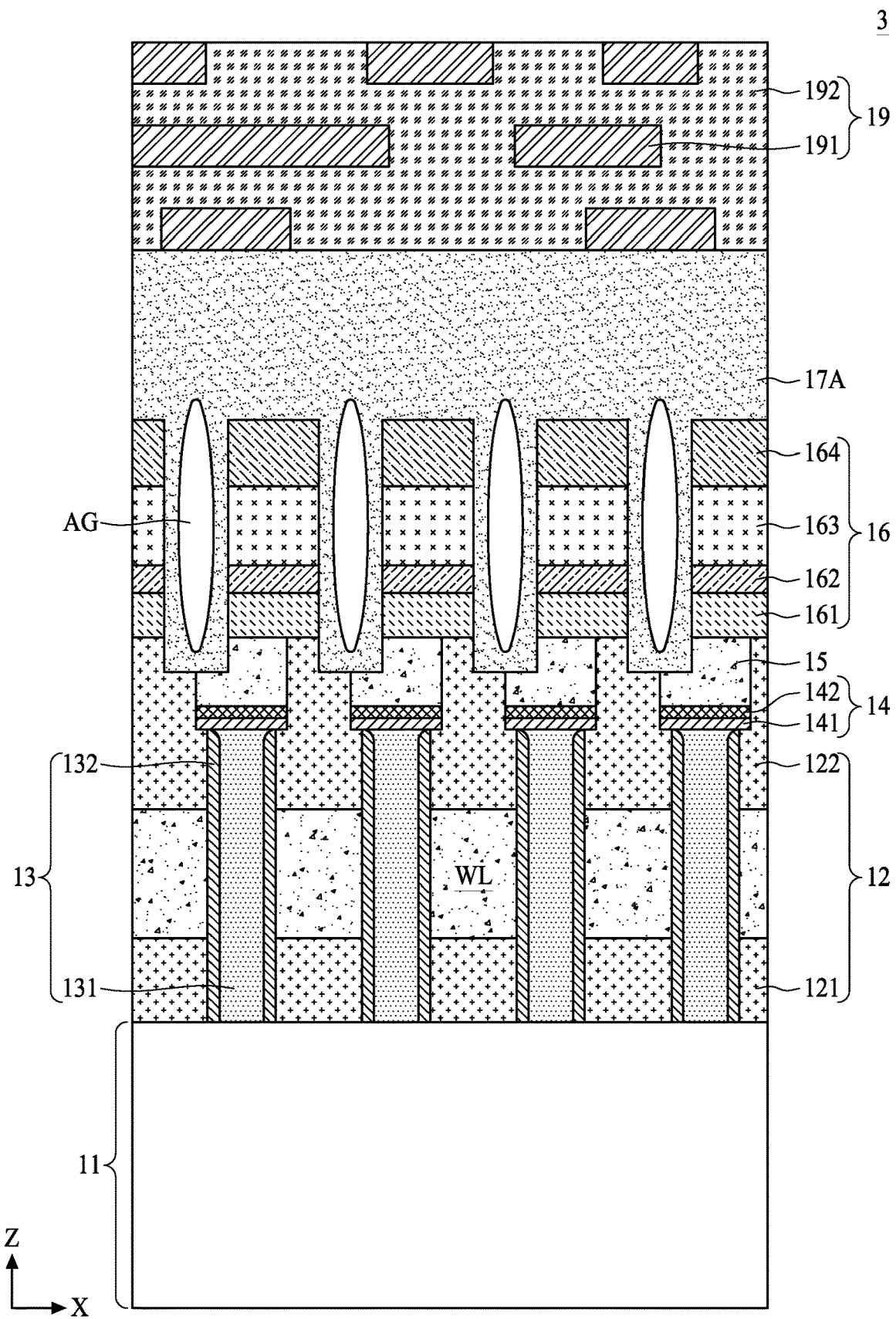

FIGS. 22 to 24 are schematic cross-sectional views at different manufacturing stages of a semiconductor structure 3 in accordance with the method M1. As described above, in alternative embodiments, the dielectric layer 17 can be a single layer. In accordance with some embodiments of the present disclosure, after the operation S11, a material with an overhead property similar to that of the first dielectric sublayer 171 of the semiconductor structure 2 is selected to form a dielectric layer 17A. Referring to FIG. 22, the operation S12 is performed on the intermediate structure of FIG. 7 but a thickness of the dielectric layer 17A is substantially equal to a total thickness of the first dielectric sublayer 171 and the second dielectric sublayer 172. A plurality of air gaps AG with specifications similar to those of the air gaps AG of the semiconductor structure 2 are formed, and details are not repeated herein. Referring to FIG. 23, the operation S14 is omitted, and the operation S15 is performed on the dielectric layer 17A with an undulating top surface (as shown in FIG. 22) to form the dielectric layer 17A with a planar top surface. The operation S16 of the method M1 is then performed on the intermediate structure of FIG. 23 to form the semiconductor structure 3 as shown in FIG. 24. Configurations of the dielectric layer 17A of the semiconductor structure 3 at different manufacturing stages as shown in FIGS. 22 to 24 are similar to overall configurations of the dielectric layer 17 of the semiconductor structure 2 at corresponding manufacturing stages. Detailed description is not repeated herein.

Figure 25:
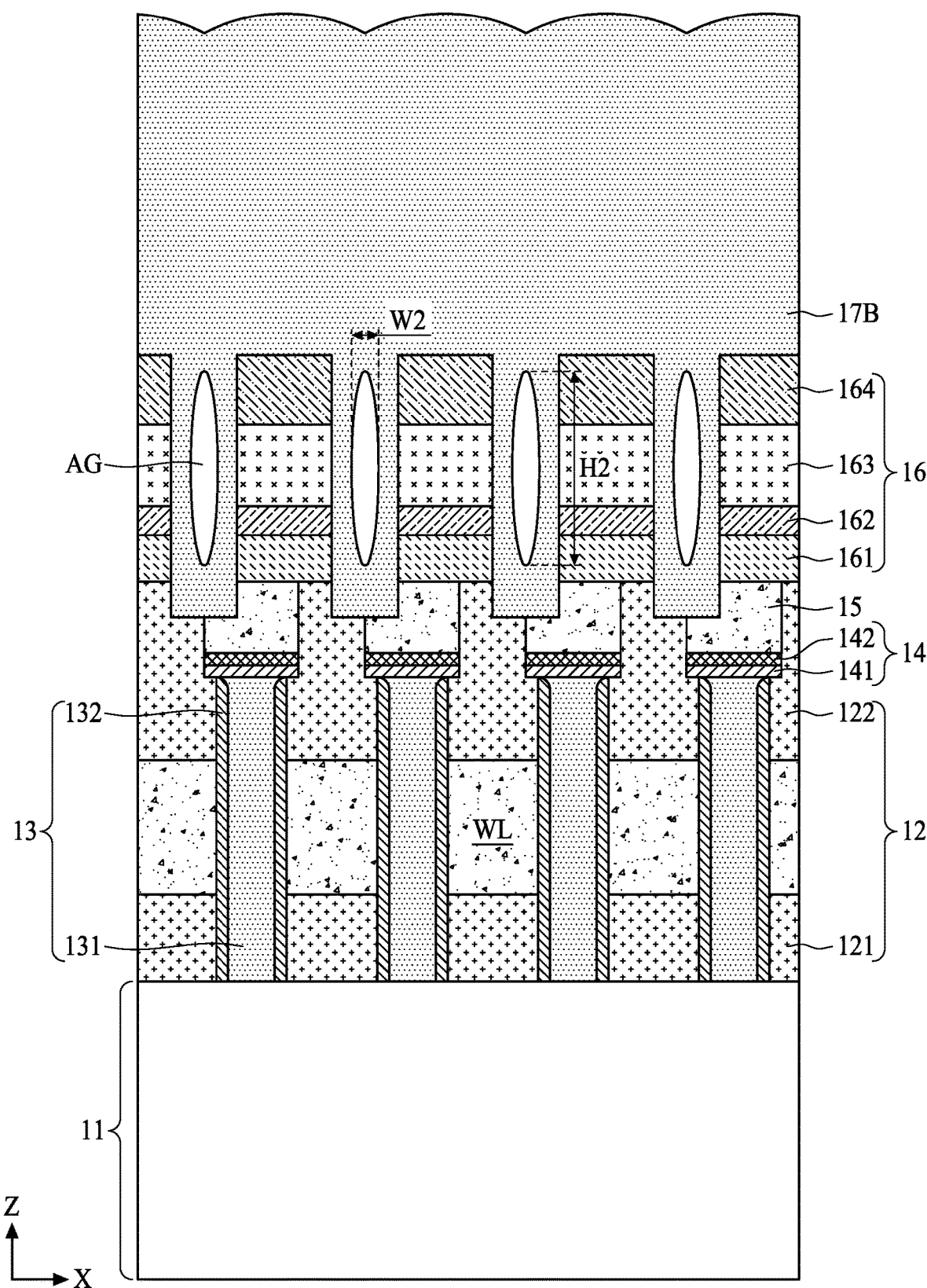
FIGS. 25 to 27 illustrate cross-sectional views of intermediate stages in the formation of a semiconductor structure in accordance with some embodiments of the present disclosure.
Figure 26:
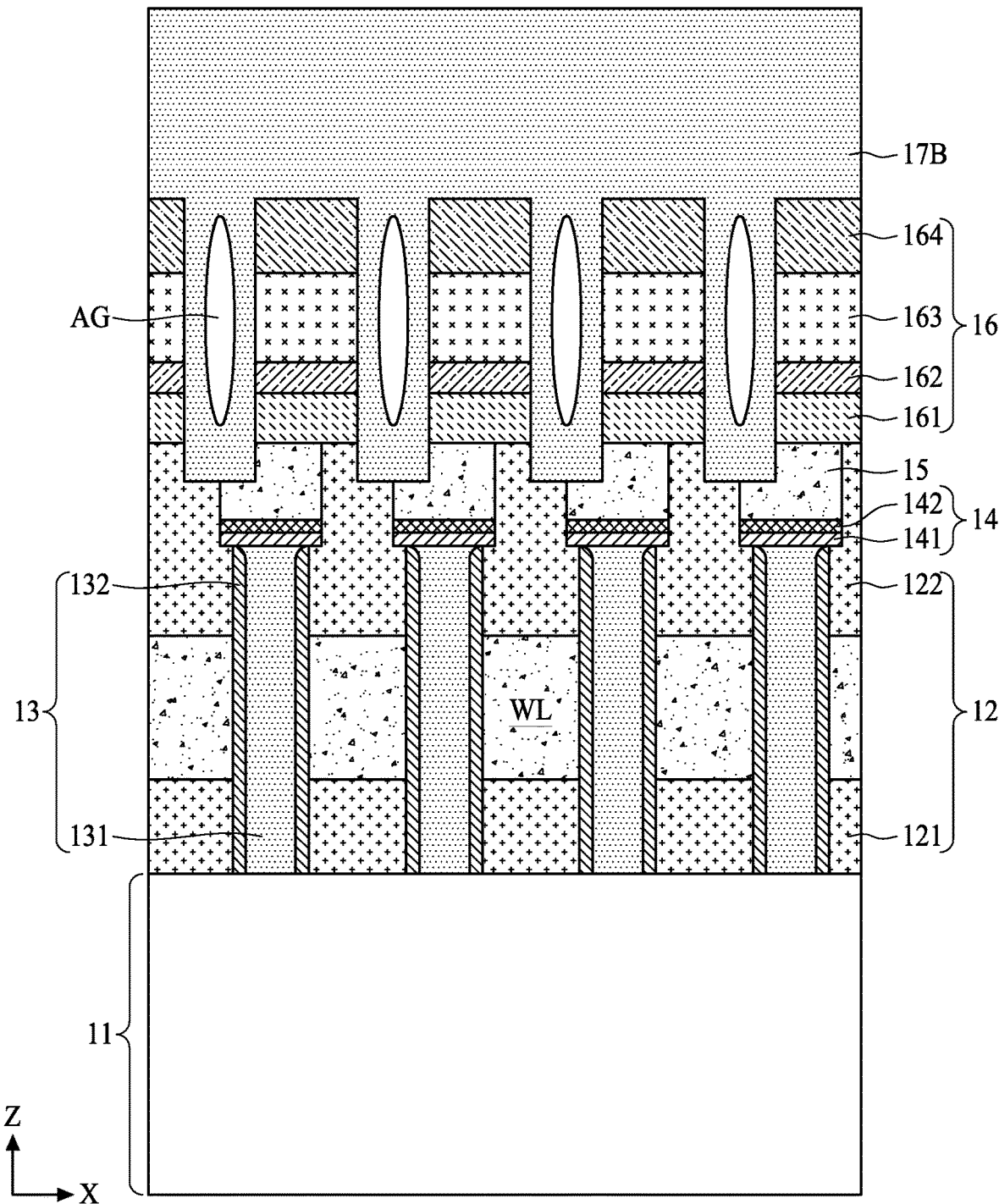
Figure 27:
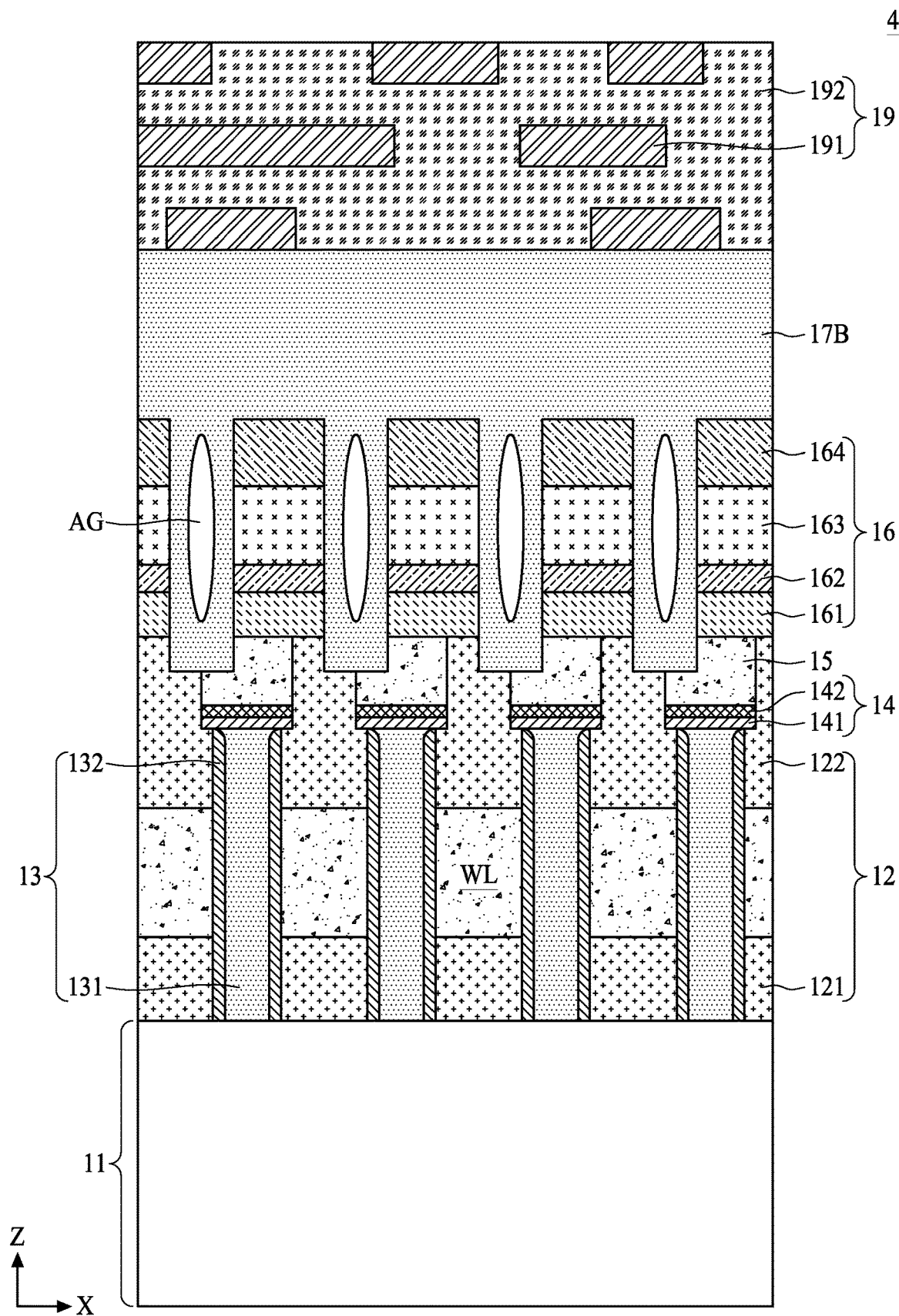

FIGS. 25 to 27 are schematic cross-sectional views at different manufacturing stages of a semiconductor structure 4 in accordance with the method M1. As described above, in alternative embodiments, the dielectric layer 17 can be a single layer. In accordance with some embodiments of the present disclosure, after the operation S11, a material with an overhead property similar to that of the second dielectric sublayer 172 of the semiconductor structure 2 is selected to form a dielectric layer 17B. Referring to FIG. 25, the operation S12 is performed on the intermediate structure of FIG. 7 but a thickness of the dielectric layer 17B is substantially equal to the total thickness of the first dielectric sublayer 171 and the second dielectric sublayer 172. A plurality of air gaps AG are formed and sealed by the dielectric layer 17B. It should be noted that a dimension of the air gaps AG of FIG. 25 is less than a dimension of the air gaps AG of FIGS. 1, 21 and 24 due to a better conformity. Referring to FIG. 26, the operation S14 is omitted, and the operation S15 is performed on the dielectric layer 17B with an undulating top surface (as shown in FIG. 25) to form the dielectric layer 17B with a planar top surface. The operation S16 of the method M1 is then performed on the intermediate structure of FIG. 26 to form the semiconductor structure 4 as shown in FIG. 27. Configurations of the dielectric layer 17B of the semiconductor structure 4 at different manufacturing stages as shown in FIGS. 25 to 27 are similar to overall configurations of the dielectric layer 17 of the semiconductor structure 2 at corresponding manufacturing stages. Detailed description is not repeated herein.

One aspect of the present disclosure provides a semiconductor structure, which includes: a substrate; a first bit line structure disposed over the substrate; a second bit line structure disposed adjacent to the first bit line structure over the substrate; a first dielectric layer, surrounding the first bit line structure and the second bit line structure; and an air gap, disposed between the first bit line structure and the second bit line structure, and sealed by the first dielectric layer, wherein a height of the air gap is greater than or equal to a height of the first bit line structure.

Another aspect of the present disclosure provides a semiconductor structure. The semiconductor structure includes: a substrate; a word line, disposed over the substrate and extending parallel to the substrate along a first direction; a first bit line, disposed over the word line and extending parallel to the substrate along a second direction different from the first direction; a second bit line, disposed at the same level as the first bit line and extending along the second direction; an air gap, disposed between the first bit line and the second bit line, and extending along the second direction; and a dielectric layer, disposed over and between the first bit line and the second bit line, wherein the air gap is at least disposed between a top of the first bit line and a top of the dielectric layer.

Another aspect of the present disclosure provides a method for manufacturing a semiconductor structure. The method includes: forming a first bit line and a second bit line over a substrate; forming a first dielectric layer conformally over the first bit line and the second bit line; and connecting a portion of the first dielectric layer over a top of the first bit line to a portion of the first dielectric layer over a top of the second bit line.

In conclusion, the application discloses a semiconductor structure, and a method for forming the semiconductor structure. The semiconductor structure includes an air gap sealed by a compound selected from the silane family having a good overhead property. A distance between a top of the air gap and a bottom of an adjacent bit line can be greater than or equal to a height of the adjacent bit line. An undesired parasitic effect can be minimized.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
   a substrate;

a first bit line structure disposed over the substrate, wherein the first bit line structure comprises a first metal layer, a first metal nitride layer, a first oxide layer, and a first nitride layer stacked in sequence from the substrate;

a second bit line structure disposed adjacent to the first bit line structure over the substrate;

a first dielectric layer, having an undulating top surface and surrounding the first bit line structure and the second bit line structure at a position that a top and sidewalls of each of the first bit line structure and the second bit line structure are enclosed by the first dielectric layer;

an air gap, disposed between the first bit line structure and the second bit line structure, and sealed by the first dielectric layer, wherein a top of the air gap is at least above a top of the first oxide layer of the first bit line structure, wherein a first portion of the top surface of the first dielectric layer above the air gap is positioned below a second portion of the top surface of the first dielectric layer above the first bit line structure, wherein the first portion of the top surface of the first dielectric layer above the first bit line structure is positioned at a same horizontal level of a third portion of the top surface of the first dielectric layer above the second bit line structure, wherein the second portion of the top surface of the first dielectric layer is extended between the first and third portions of the top surface of the first dielectric layer to form the undulating top surface thereof; and a second dielectric layer disposing on the undulating top surface of the first dielectric layer, wherein a thickness of the first dielectric layer is greater than a thickness of the second dielectric layer, wherein the first dielectric layer and the second dielectric layer are made of different silanes, wherein a bottom surface of the second dielectric layer is in direct contact with the undulating top surface of the first dielectric layer;

wherein a distance between the top of the air gap and the undulating top surface of the first dielectric layer is smaller than a distance between the top of the first bit line structure and the undulating top surface of the first dielectric layer;

wherein a height of the air gap is greater than or equal to a height of the first bit line structure;

wherein a width of the air gap is smaller than a width of each of the first bit line structure and the second bit line structure;

wherein a bottom of the air gap is positioned below a bottom of each of the first bit line structure and the second bit line structure.

2. The semiconductor structure of claim 1, wherein a top and sidewalls of the first nitride layer are enclosed by the first dielectric layer, wherein sidewalls of the first metal layer, the first metal nitride layer, and the first oxide layer are enclosed by the first dielectric layer.

3. The semiconductor structure of claim 2, wherein a vertical distance between the top of the air gap and the bottom of the first bit line structure is greater than the height of the first bit line structure, wherein the first metal layer, the first metal nitride layer, the first oxide layer, and the first nitride layer have the same width, wherein the first metal layer, the first metal nitride layer, the first oxide layer, and the first nitride layer have different thicknesses, wherein a distance between the top of the air gap and the undulating top surface of the first dielectric layer is smaller than a distance between the top of the first nitride layer of the first bit line structure and the undulating top surface of the first dielectric layer.

4. The semiconductor structure of claim 1, wherein the second bit line structure includes a second metal layer, a second metal nitride layer, a second oxide layer, and a second nitride layer stacked in sequence from the substrate, such that a top and sidewalls of the second nitride layer are enclosed by the first dielectric layer, wherein sidewalls of the second metal layer, the second metal nitride layer, and the second oxide layer are enclosed by the first dielectric layer.

5. The semiconductor structure of claim 4, wherein a vertical distance between the top of the air gap and the bottom of the second bit line structure is greater than or equal to a height of the second bit line structure, wherein the second metal layer, the second metal nitride layer, the second oxide layer, and the second nitride layer have the same width, wherein the second metal layer, the second metal nitride layer, the second oxide layer, and the second nitride layer have the same thicknesses of the first metal layer, the first metal nitride layer, the first oxide layer, and the first nitride layer respectively, wherein a distance between the top of the air gap and the undulating top surface of the first dielectric layer is smaller than a distance between the top of the second nitride layer of the second bit line structure and the undulating top surface of the first dielectric layer.

6. The semiconductor structure of claim 1, further comprising:

a landing pad, disposed between the substrate and the first bit line structure, and electrically connected to the first bit line structure.

7. A semiconductor structure, comprising:

a substrate;

a first bit line structure disposed over the substrate, wherein the first bit line structure comprises a first metal layer, a first metal nitride layer, a first oxide layer, and a first nitride layer stacked in sequence from the substrate;

a second bit line structure disposed adjacent to the first bit line structure over the substrate;

a first dielectric layer, having an undulating top surface and surrounding the first bit line structure and the second bit line structure at a position that a top and sidewalls of each of the first bit line structure and the second bit line structure are enclosed by the first dielectric layer;

an air gap, disposed between the first bit line structure and the second bit line structure, and sealed by the first dielectric layer, wherein a top of the air gap is at least above a top of the first oxide layer of the first bit line structure, wherein a first portion of the top surface of the first dielectric layer above the air gap is positioned below a second portion of the top surface of the first dielectric layer above the first bit line structure, wherein the first portion of the top surface of the first dielectric layer above the first bit line structure is positioned at a same horizontal level of a third portion of the top surface of the first dielectric layer above the second bit line structure, wherein the second portion of the top surface of the first dielectric layer is extended between the first and third portions of the top surface of the first dielectric layer to form the undulating top surface thereof; and a second dielectric layer, disposed over the first dielectric layer at a position that a bottom surface of the second dielectric layer is in direct contact with the undulating top surface of the first dielectric layer, wherein a deposition rate of the first dielectric layer is different from a deposition rate of the second dielectric layer;

wherein a distance between the top of the air gap and the undulating top surface of the first dielectric layer is smaller than a distance between the top of the first bit line structure and the undulating top surface of the first dielectric layer;

wherein a height of the air gap is greater than or equal to a height of the first bit line structure;

wherein a width of the air gap is smaller than a width of each of the first bit line structure and the second bit line structure;

wherein a bottom of the air gap is positioned below a bottom of each of the first bit line structure and the second bit line structure.

8. The semiconductor structure of claim 7, wherein the first dielectric layer and the second dielectric layer include different silanes, wherein the deposition rate of the second dielectric layer is less than the deposition rate of the second dielectric layer.

\* \* \* \* \*